United States Patent
Takizawa

(10) Patent No.: US 9,595,311 B2
(45) Date of Patent: Mar. 14, 2017

(54) NONVOLATILE SEMICONDUCTOR MEMORY DEVICE

(71) Applicant: KABUSHIKI KAISHA TOSHIBA, Minato-ku, Tokyo (JP)

(72) Inventor: Ryousuke Takizawa, Naka Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/543,236

(22) Filed: Nov. 17, 2014

(65) Prior Publication Data

US 2016/0049186 A1  Feb. 18, 2016

Related U.S. Application Data

(60) Provisional application No. 62/036,761, filed on Aug. 13, 2014.

(51) Int. Cl.
   *G11C 11/16* (2006.01)
   *G11C 13/00* (2006.01)
   (Continued)

(52) U.S. Cl.
   CPC ...... *G11C 11/1673* (2013.01); *G11C 11/1675* (2013.01); *G11C 11/1677* (2013.01); *G11C 11/1693* (2013.01); *G11C 13/0061* (2013.01); *G11C 13/0064* (2013.01); *G11C 13/0069* (2013.01); *G11C 17/16* (2013.01); *G11C 17/165* (2013.01); *G11C 17/18* (2013.01); *G11C 29/702* (2013.01); *G11C 2013/0073* (2013.01); *G11C 2213/79* (2013.01)

(58) Field of Classification Search
   CPC .................................................. G11C 11/1673
   USPC ......................................................... 365/158
   See application file for complete search history.

(56) References Cited

U.S. PATENT DOCUMENTS

| | | | |
|---|---|---|---|
| 6,724,653 B1 * | 4/2004 | Iwata | G11C 8/10 365/145 |
| 2002/0114192 A1 * | 8/2002 | Takase | G11C 11/5628 365/185.28 |

(Continued)

FOREIGN PATENT DOCUMENTS

| | | |
|---|---|---|
| JP | 2005071481 A | 3/2005 |
| JP | 2009043384 A | 2/2009 |

(Continued)

OTHER PUBLICATIONS

International Search Report (ISR) including Written Opinion (in English) dated Nov. 2, 2015, issued in parent International Application No. PCT/JP2015/072941.

(Continued)

*Primary Examiner* — Hoai V Ho
*Assistant Examiner* — Muna A Techane
(74) *Attorney, Agent, or Firm* — Holtz, Holtz & Volek PC

(57) ABSTRACT

According to one embodiment, nonvolatile semiconductor memory device comprises: a memory mat including a memory cell having a variable resistance element; a write driver which applies a write current to the memory cell in one of a first direction and a second direction opposite to the first direction in write; and a read driver which applies a verify read current to the memory cell in one of the first direction and the second direction in verify read after write.

20 Claims, 17 Drawing Sheets

(51) Int. Cl.
    *G11C 17/16*     (2006.01)
    *G11C 17/18*     (2006.01)
    *G11C 29/00*     (2006.01)

(56) References Cited

U.S. PATENT DOCUMENTS

| | | |
|---|---|---|
| 2005/0047202 A1 | 3/2005 | Shimizu et al. |
| 2008/0247222 A1 | 10/2008 | Jung et al. |
| 2009/0225586 A1* | 9/2009 | Ueda .............................. 365/158 |
| 2010/0085795 A1* | 4/2010 | Zhu ........................ G11C 11/16 365/148 |
| 2010/0238712 A1* | 9/2010 | Xi ........................... G11C 11/16 365/148 |
| 2011/0078538 A1 | 3/2011 | Ikegawa et al. |
| 2011/0222355 A1 | 9/2011 | Nakashima et al. |
| 2013/0088911 A1 | 4/2013 | Nakura et al. |
| 2014/0098595 A1* | 4/2014 | Kawashima .......... H01L 27/101 365/148 |

FOREIGN PATENT DOCUMENTS

| | | |
|---|---|---|
| JP | 2009211792 A | 9/2009 |
| JP | 2010524144 A | 7/2010 |

OTHER PUBLICATIONS

Taiwanese Office Action dated Jul. 21, 2016 (and English translation thereof) issued in counterpart Taiwanese Application No. 104126435.

* cited by examiner

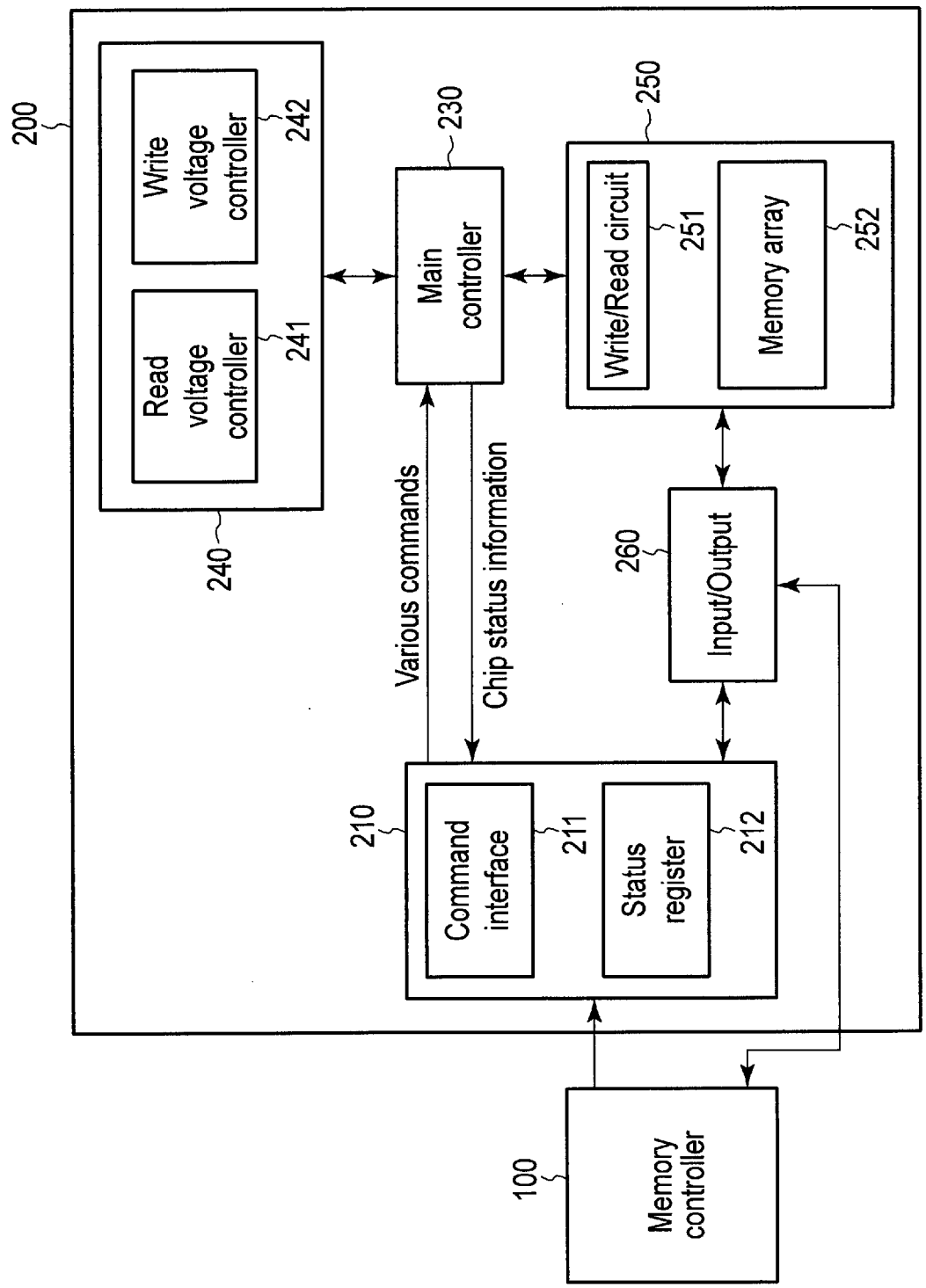
F I G. 2

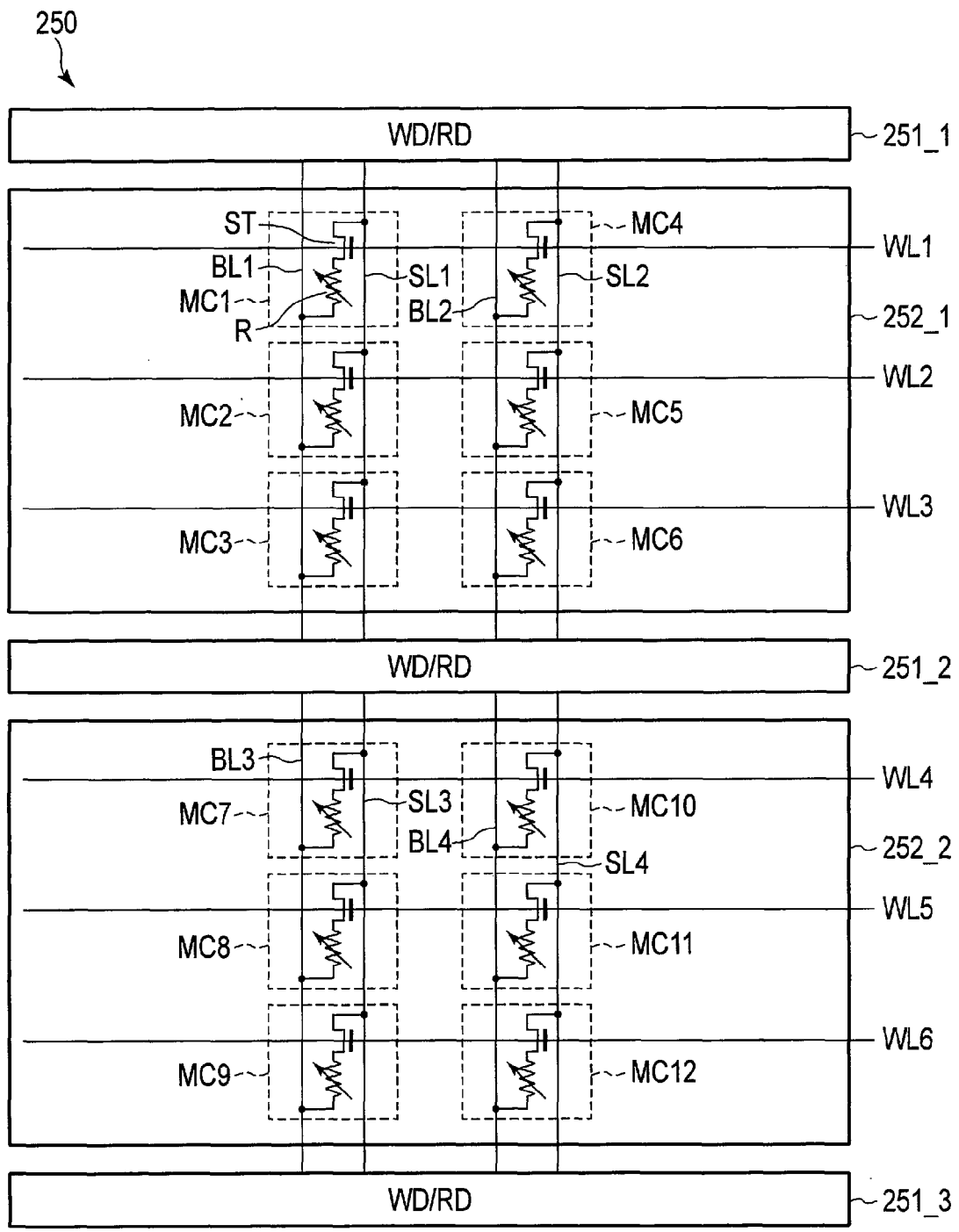
F I G. 3

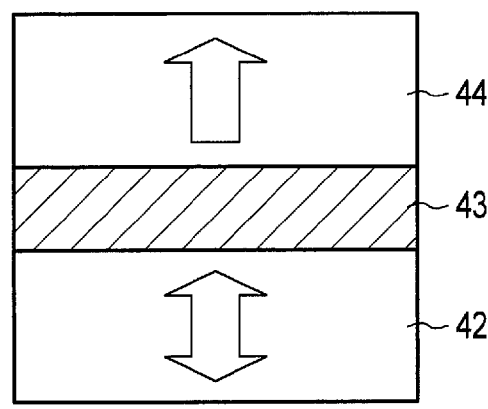
F I G. 4A
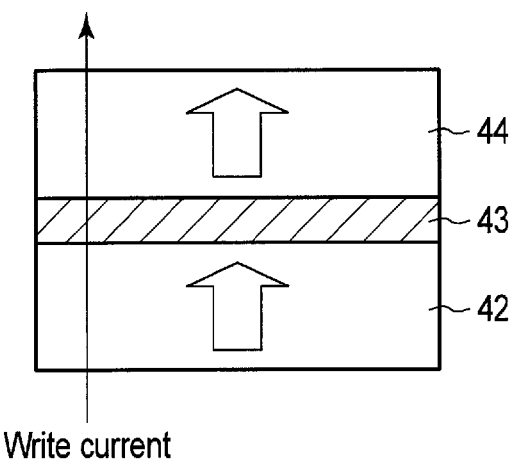
F I G. 4B     Parallel state (Low resistance)
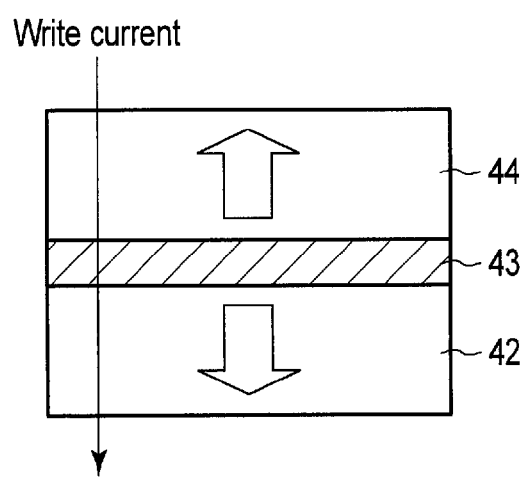
F I G. 4C     Antiparallel state (High resistance)

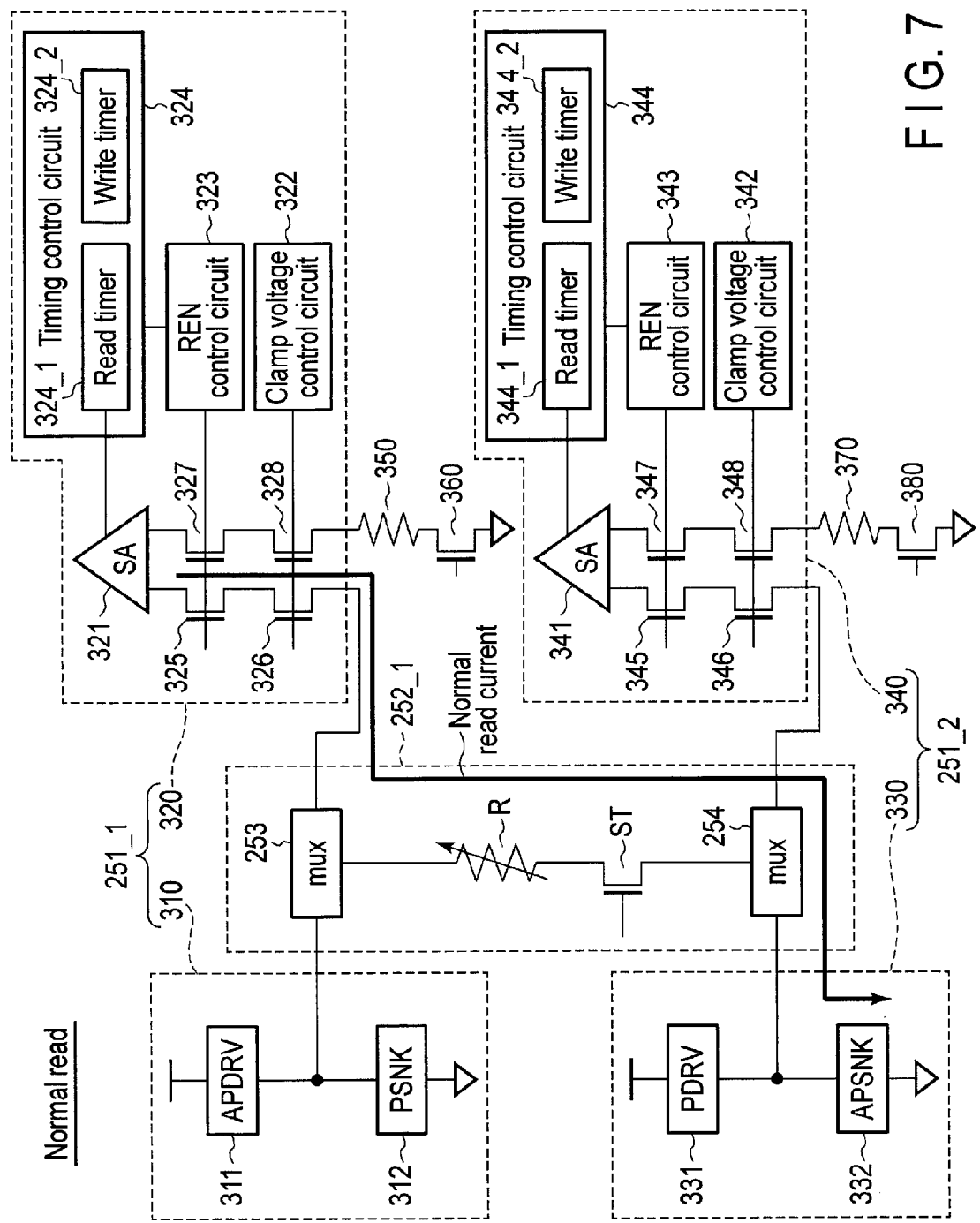
F I G. 7

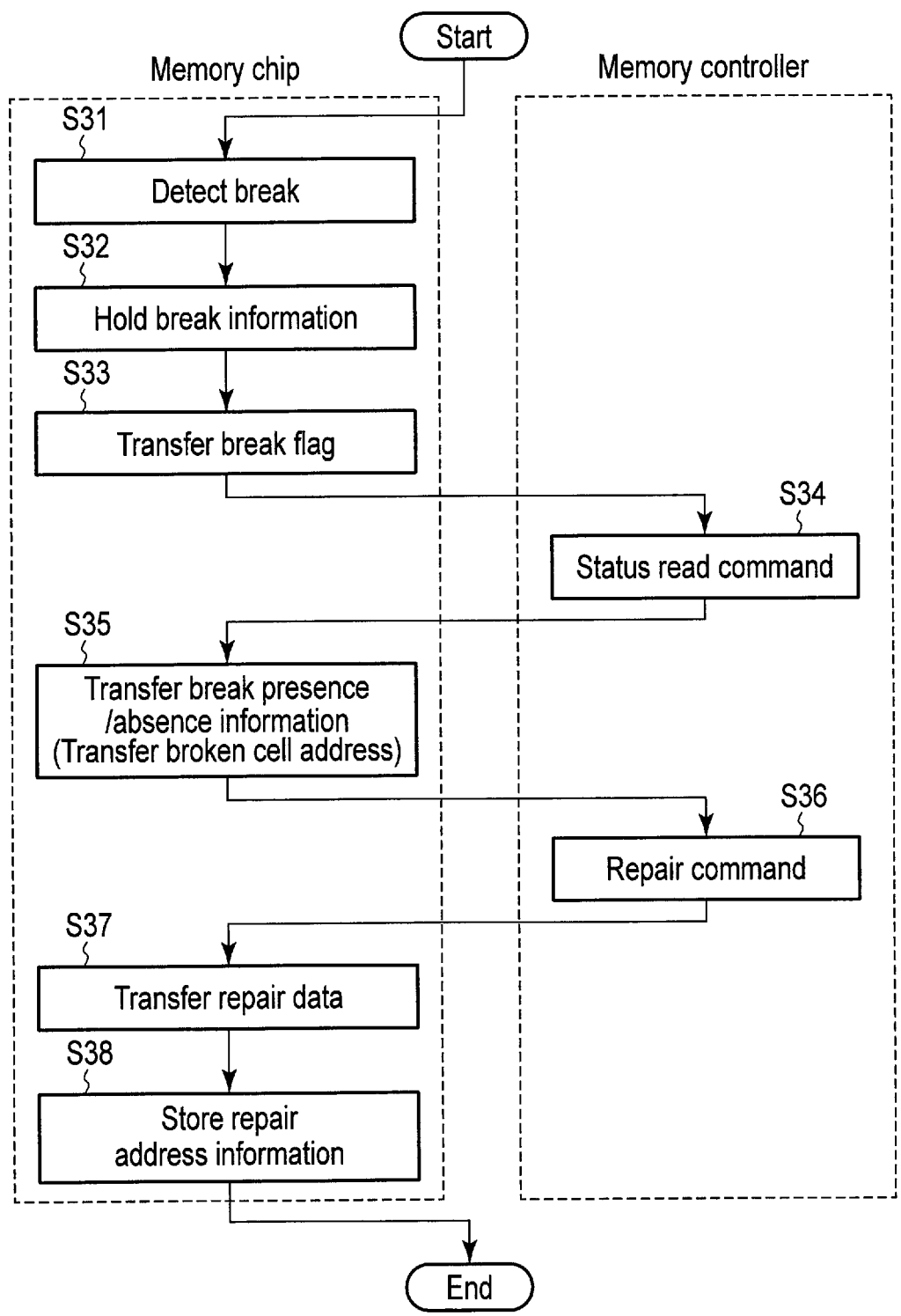
F I G. 14

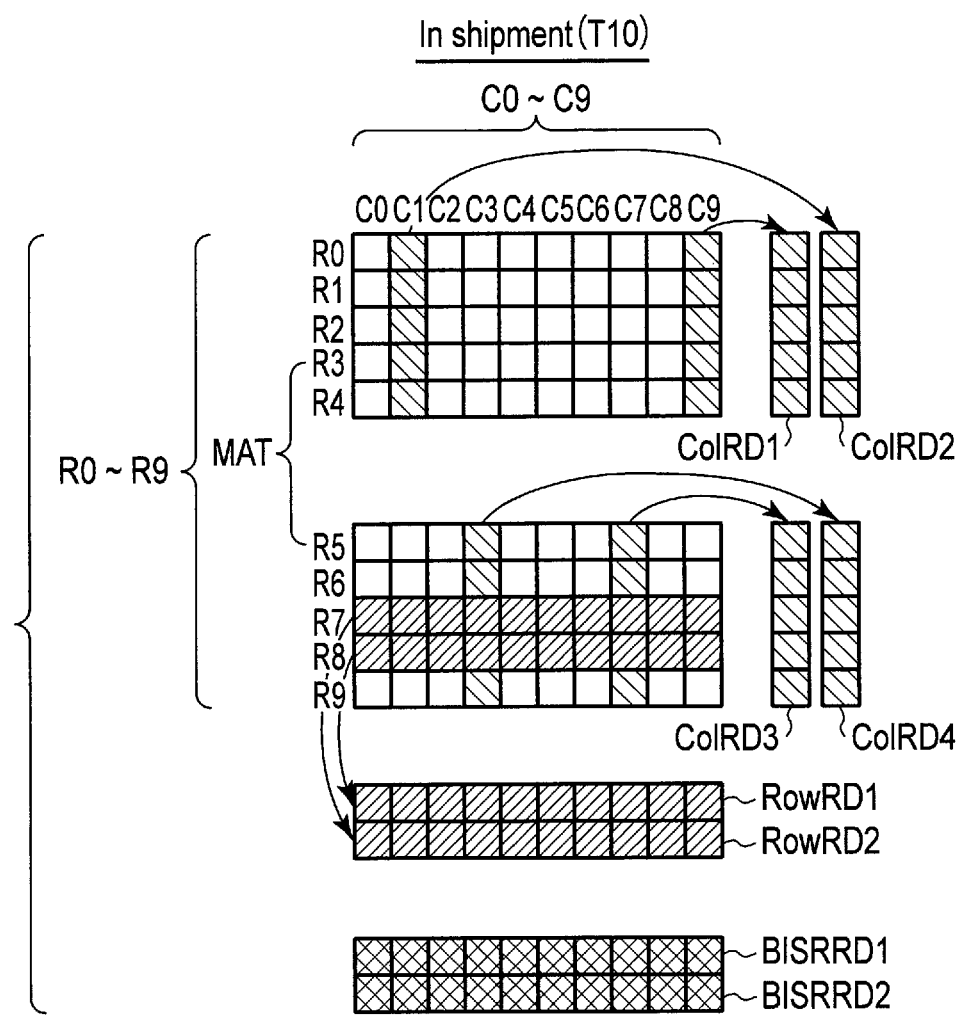
F I G. 15A

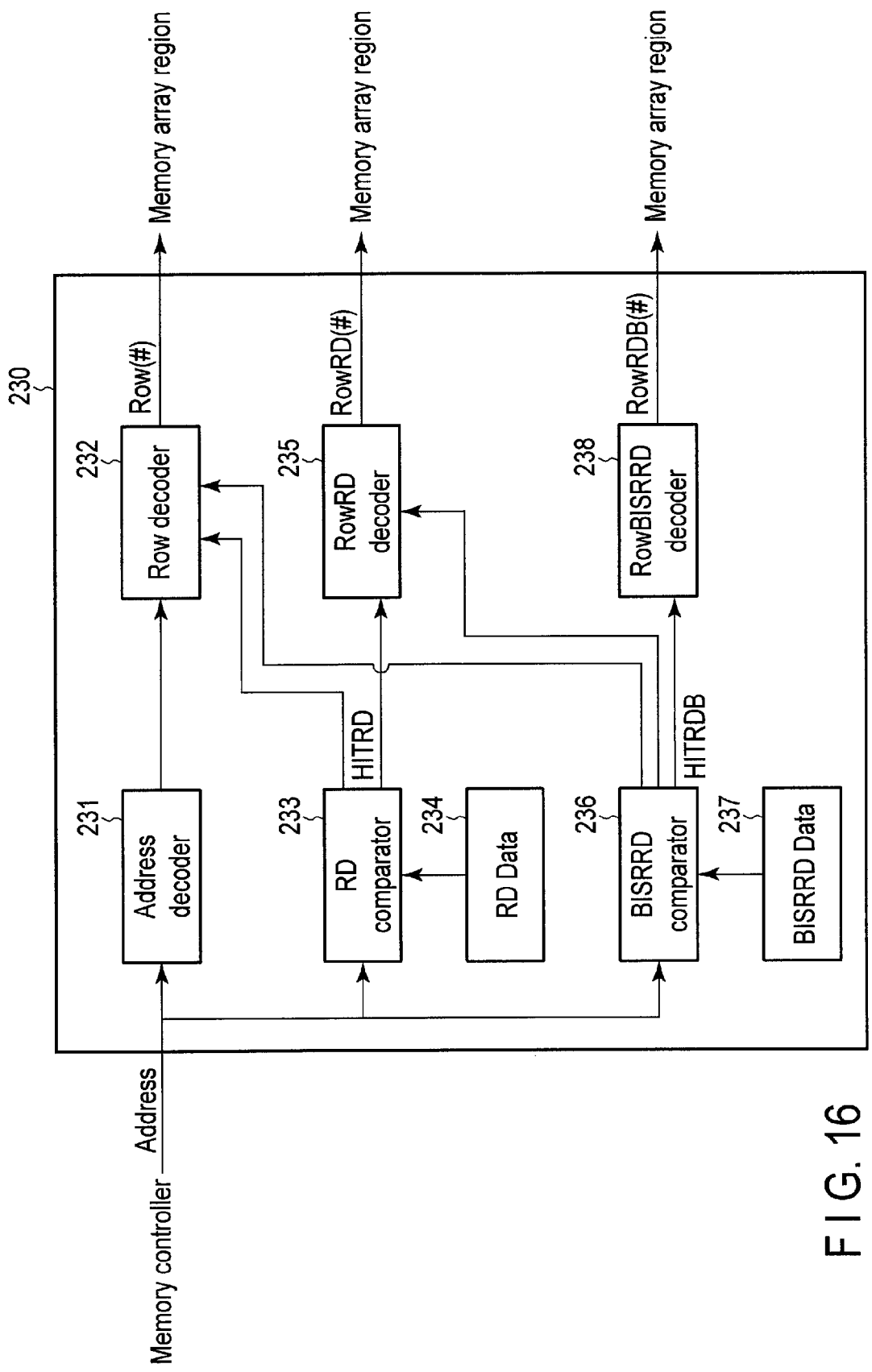
F I G. 16

NONVOLATILE SEMICONDUCTOR MEMORY DEVICE

CROSS REFERENCE TO RELATED APPLICATIONS

This application is based upon and claims the benefit of priority from U.S. Provisional Application No. 62/036,761, filed Aug. 13, 2014, the entire contents of all of which are incorporated herein by reference.

FIELD

Embodiments described herein relate generally to a nonvolatile semiconductor memory device.

BACKGROUND

An MRAM (Magnetic Random Access Memory) is a memory device using a memory element having a magnetoresistive effect as a memory cell for storing information. The MRAM is attracting attention as a next-generation memory device capable of a high-speed operation and having a large-capacity and non-volatility.

BRIEF DESCRIPTION OF THE DRAWINGS

FIG. 2 is a schematic view showing the arrangement of the memory chip according to the first embodiment;

FIG. 3 is a schematic view showing a memory array region according to the first embodiment;

FIG. 4A is a sectional view showing an outline of the arrangement of a magnetoresistive element;

FIG. 4B is a sectional view for explaining a write operation of the magnetoresistive element in a parallel state;

FIG. 4C is a sectional view for explaining a write operation of the magnetoresistive element in an antiparallel state;

FIG. 7 is a schematic view showing a normal read operation of the memory chip according to the first embodiment;

FIG. 14 is a flowchart showing break detection and a repair method in a nonvolatile semiconductor memory device according to the third embodiment;

FIG. 15A is a view schematically showing a repair method at time T10 in product shipment according to the third embodiment;

FIG. 16 is a schematic view showing the arrangement of a main controller according to the third embodiment.

DETAILED DESCRIPTION

Figure 1:
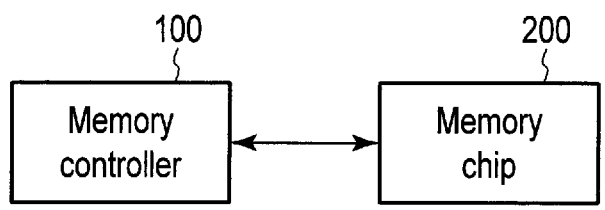
FIG. 1 is a schematic view showing the connection relationship between a memory chip and memory controller according to the first embodiment.

In a spin transfer torque MRAM, data is written in a memory cell by using a tunneling current. Therefore, the tunneling current sometimes breaks an insulating film (tunnel insulating film) of the memory cell, thereby posing a reliability problem. This makes it necessary to perform verify read which detects this insulating film break (break detection), and verifies whether desired data is written in the memory cell.

Like normal read, verify read applies a read current and detects the resistance value of a memory cell (MTJ element). However, while write currents bidirectionally flow through a memory cell in write, the read current unidirectionally flows in read. Therefore, the read current is required to have a small current value so as not to cause read disturb, and is further decreased by downsizing. When the read current thus decreases, the read time must be prolonged in addition to scaling in order to accurately read a signal (current).

These problems of the read current and read time similarly arise in verify read. Accordingly, when verify read including break detection is performed after write, the time of the write operation (write and verify read) is lengthened.

In general, according to one embodiment, a nonvolatile semiconductor memory device includes a memory mat including a memory cell having a variable resistance element, a write driver which applies a write current to the memory cell in a first direction or a second direction opposite to the first direction in write, and a read driver which applies a verify read current to the memory cell in the first direction or the second direction in verify read after write.

This embodiment will be explained below with reference to the accompanying drawings. In these drawings, the same reference numerals denote the same parts. Also, a repetitive explanation will be made as needed.

<First Embodiment>

A nonvolatile semiconductor memory device according to the first embodiment will be explained below with reference to FIGS. 1, 2, 3, 4A, 4B, 4C, 5, 6, 7, 8, 9, and 10. In the first embodiment, in verify read after write, a verify read current is applied to a memory cell MC in a direction in which data (AP data or P data) is written in the memory cell MC. This makes it possible to increase the verify read current, and shorten the verify read time. Details of the first embodiment will be explained below.

[Arrangement of First Embodiment]

The arrangement of the nonvolatile semiconductor memory device according to the first embodiment will be explained with reference to FIGS. 1, 2, 3, 4A, 4B, 4C, and 5. This arrangement will be explained by taking an MRAM which stores data by using a magnetoresistive element (MTJ element) as an example, but the present invention is not limited to this. This embodiment is applicable to all memories that include a variable resistance element which changes in resistance value when a current is supplied, and stores data in accordance with the resistance value.

FIG. 1 is a schematic view showing the connection relationship between a memory chip and memory controller according to the first embodiment.

As shown in FIG. 1, a memory chip 200 is electrically connected to a memory controller 100. The memory chip 200 operates in accordance with a command from the memory controller 100.

FIG. 2 is a schematic view showing the arrangement of the memory chip according to the first embodiment.

As shown in FIG. 2, the memory chip 200 includes an interface circuit 210, main controller 230, voltage controller 240, memory cell array region 250, and input/output circuit 260.

The interface circuit 210 includes a command interface 211 and status register 212. The command interface 211 receives various commands (e.g., write, read, erase, and address commands) from an external device (the memory controller 100), and transfers the commands to the main controller 230. The status register 212 temporarily stores status information of the memory chip 200, which is transferred from the main controller 230, and transfers the information to the memory controller 100 via the input/output circuit 260.

The main controller 230 receives a command from the memory controller 100 via the command interface 211, and controls a data write, read, or erase operation to the memory cell array region 250 in accordance with the command. Also, when a command from the memory controller 100 is a read command or write command, the main controller 230 receives a control signal from the voltage controller 240, and controls each operation.

The voltage controller 240 includes a read voltage controller 241 and write voltage controller 242. When the main controller 230 receives a read command, the read voltage controller 241 transfers a control signal related to the voltage of a read operation (normal read operation) to the main controller 230. When the main controller 230 receives a write command, the write voltage controller 242 transfers, to the main controller 230, a control signal related to the voltage of a write operation, and a control signal related to the voltage of a verify read operation after write.

Note that in this specification, a normal read operation is a read operation corresponding to a read command, and a verify read operation is a read operation after write corresponding to a write command.

The memory array region 250 includes a write/read circuit 251 and memory array 252. The memory array 252 includes a plurality of memory mats 252_1 and 252_2 (to be described later). The memory array 252 (memory mats 252_1 and 252_2) includes a plurality of memory cells MC two-dimensionally arranged in a matrix. The write/read circuit 251 includes a plurality of write/read drivers 251_1 to 251_3 (to be described later). The write/read circuit 251 performs a write operation and read operation on the memory array 252 under the control of the main controller 230.

The input/output circuit 260 transfers, to the memory controller 100, the data information of the memory array region 250, and the status information of the memory chip 200, which is stored in the status register 212.

FIG. 3 is a schematic view showing the memory array region according to the first embodiment.

As shown in FIG. 3, the memory array 252 includes the plurality of memory mats 252_1 and 252_2, and the write/read circuit 251 includes the plurality of write/read drivers 251_1 to 251_3. The plurality of memory mats 252_1 and 252_2 and the plurality of write/read drivers 251_1 to 251_3 are alternately arranged in a first direction (column direction).

More specifically, the write/read driver 251_1 is arranged adjacent to one side of the memory mat 252_1 along the first direction, and the write/read driver 251_2 is arranged adjacent to the other side. Also, the write/read driver 251_2 is arranged adjacent to one side of the memory mat 252_2 along the first direction, and the write/read driver 251_3 is arranged adjacent to the other side.

In the memory mat 252_1, bit lines BL1 and BL2, source lines SL1 and SL2, word lines WL1 to WL3, and memory cells MC1 to MC6 are arranged. When it is not particularly necessary to distinguish between the individual elements in the following explanation, they will simply be referred to as bit lines BL, source lines SL, word lines WL, and memory cells MC.

The bit line BL1 runs in the first direction. The source line SL1 is adjacent to the bit line BL1 in a second direction (row direction) perpendicular to the first direction, and runs in the first direction. The bit line BL1 is electrically connected to one or both of the write/read drivers 251_1 and 251_2. The source line SL1 is electrically connected to the other one or both of the write/read drivers 251_1 and 251_2.

The bit line BL2 is adjacent to the source line SL2 in the second direction, and runs in the first direction. The source line SL2 is adjacent to the bit line BL2 in the second direction, and runs in the first direction. The bit line BL2 is electrically connected to one or both of the write/read drivers 251_1 and 251_2. The source line SL1 is electrically connected to the other one or both of the write/read drivers 251_1 and 251_2.

As described above, the bit lines BL1 and BL2 and source lines SL1 and SL2 run in the first direction, and are alternately adjacent to each other along the second direction. In other words, the bit line BL1, source line SL1, bit line BL2, and source line SL2 are arranged in this order along the second direction.

The word lines WL1 to WL3 run in the second direction, and are perpendicular to the bit lines BL1 and BL2 and source lines SL1 and SL2. The word lines WL1 to WL3 are adjacent to each other in this order along the first direction.

Each of the memory cells MC1 to MC4 includes a variable resistance element R and switching element (selection transistor) ST. In this embodiment, a magnetoresistive element is used as the variable resistance element R.

The memory cell MC1 is arranged between the bit line BL1 and source line SL1. More specifically, the variable resistance element R in the memory cell MC has one terminal electrically connected to the bit line BL1, and the other terminal electrically connected to one end of the current path of the selection transistor ST. The other end of the current path of the selection transistor ST in the memory cell MC1 is electrically connected to the source line SL1. Also, the gate of the selection transistor ST in the memory cell MC1 is electrically connected to the word line WL.

Likewise, the memory cell MC2 is arranged between the bit line BL1 and source line SL1, and the gate of the selection transistor ST of the memory cell MC2 is electrically connected to the word line WL2. The memory cell MC3 is arranged between the bit line BL1 and source line SL1, and the gate of the selection transistor ST of the memory cell MC3 is electrically connected to the word line WL3. The memory cell MC4 is arranged between the bit line BL2 and source line SL2, and the gate of the selection transistor ST of the memory cell MC4 is electrically connected to the word line WL1. The memory cell MC5 is arranged between the bit line BL2 and source line SL2, and the gate of the selection transistor ST of the memory cell MC5 is electrically connected to the word line WL2. The memory cell MC6 is arranged between the bit line BL2 and source line SL2, and the gate of the selection transistor ST of the memory cell MC6 is electrically connected to the word line WL3.

A read operation and write operation on the memory cells MC in the memory mat 252_1 are performed by the write/read drivers 251_1 and 251_2 arranged adjacent to the two sides of the memory mat 252_1.

In the memory mat 252_2, bit lines BL3 and BL4, source lines SL3 and SL4, word lines WL4 to WL6, and memory cells MC7 to MC12 are arranged. The memory mat 252_2 has the same arrangement as that of the memory mat 252_1, so an explanation thereof will be omitted.

A read operation and write operation on the memory cells MC in the memory mat 252_2 are performed by the write/read drivers 251_2 and 251_3 arranged adjacent to the two sides of the memory mat 252_2.

FIG. 4A is a sectional view showing an outline of the arrangement of the variable resistance element (magnetoresistive element) R. FIG. 4A mainly shows a memory layer 42, tunnel barrier layer 43, and reference layer 44 as the magnetoresistive element R.

As shown in FIG. 4A, the magnetoresistive element R has a stack including the memory layer 42 as a ferromagnetic layer, the reference layer 44 as a ferromagnetic layer, and the tunnel barrier layer 43 as a nonmagnetic layer formed between them.

The memory layer 42 is a ferromagnetic layer in which the magnetization direction is variable, and has perpendicular magnetic anisotropy which is perpendicular to or almost perpendicular to the film surfaces (upper surface/lower surface). "The magnetization direction is variable" herein mentioned indicates that the magnetization direction changes with respect to a predetermined write current. Also, "almost perpendicular" means that the direction of residual magnetization falls within the range of $45°<\theta\leq 90°$ with respect to the film surfaces.

The tunnel barrier layer 43 is formed on the memory layer 42. The tunnel barrier layer 43 is a nonmagnetic layer, and made of, e.g., MgO.

The reference layer 44 is formed on the tunnel barrier layer 43. The reference layer 44 is a ferromagnetic layer in which the magnetization direction is invariable, and has perpendicular magnetic anisotropy which is perpendicular to or almost perpendicular to the film surfaces. "The magnetization direction is invariable" herein mentioned indicates that the magnetization direction is invariable with respect to the predetermined write current. That is, the reference layer 44 has a switching energy barrier larger than that of the memory layer 42 in the magnetization direction.

FIG. 4B is a sectional view for explaining a write operation of the magnetoresistive element in a parallel state (P state). FIG. 4C is a sectional view for explaining a write operation of the magnetoresistive element in an antiparallel state (AP state).

The magnetoresistive element R is, e.g., a spin transfer torque magnetoresistive element. Therefore, when writing data to the magnetoresistive element R or reading data from the magnetoresistive element R, currents are bidirectionally supplied to the magnetoresistive element R in a direction perpendicular to the film surfaces.

More specifically, data is written to the magnetoresistive element R as follows.

As shown in FIG. 4B, when a current flows from the memory layer 42 to the reference layer 44, i.e., when electrons moving from the reference layer 44 to the memory layer 42 are supplied, electrons spin-polarized in the same direction as the magnetization direction in the reference layer 44 are injected into the memory layer 42. In this case, the magnetization direction in the memory layer 42 is matched with that in the reference layer 44. Consequently, the magnetization directions in the reference layer 44 and memory layer 42 are arranged parallel. In this parallel state, the resistance value of the magnetoresistive element R is smallest. This state is defined as, e.g., data '0'.

On the other hand, as shown in FIG. 4C, when a current flows from the reference layer 44 to the storage layer 42, i.e., when electrons moving from the memory layer 42 to the reference layer 44 are supplied, electrons reflected by the reference layer 44 and thereby spin-polarized in a direction opposite to the magnetization direction in the reference layer 44 are injected into the memory layer 42. In this case, the magnetization direction in the memory layer 42 is matched with the direction opposite to the magnetization direction in the reference layer 44. Consequently, the magnetization directions in the reference layer 44 and memory layer 42 are arranged antiparallel. In this antiparallel state, the resistance value of the magnetoresistive element R is largest. This state is defined as, e.g., data '1'.

Also, data is read from the magnetoresistive element R as follows.

A read current is supplied to the magnetoresistive element R. This read current is set at a value (a value smaller than the write current) with which the magnetization direction in the memory layer 42 does not reverse. The above-mentioned data '0' or '1' can be read by detecting the change in resistance value of the magnetoresistive element R in this state.

Figure 5:
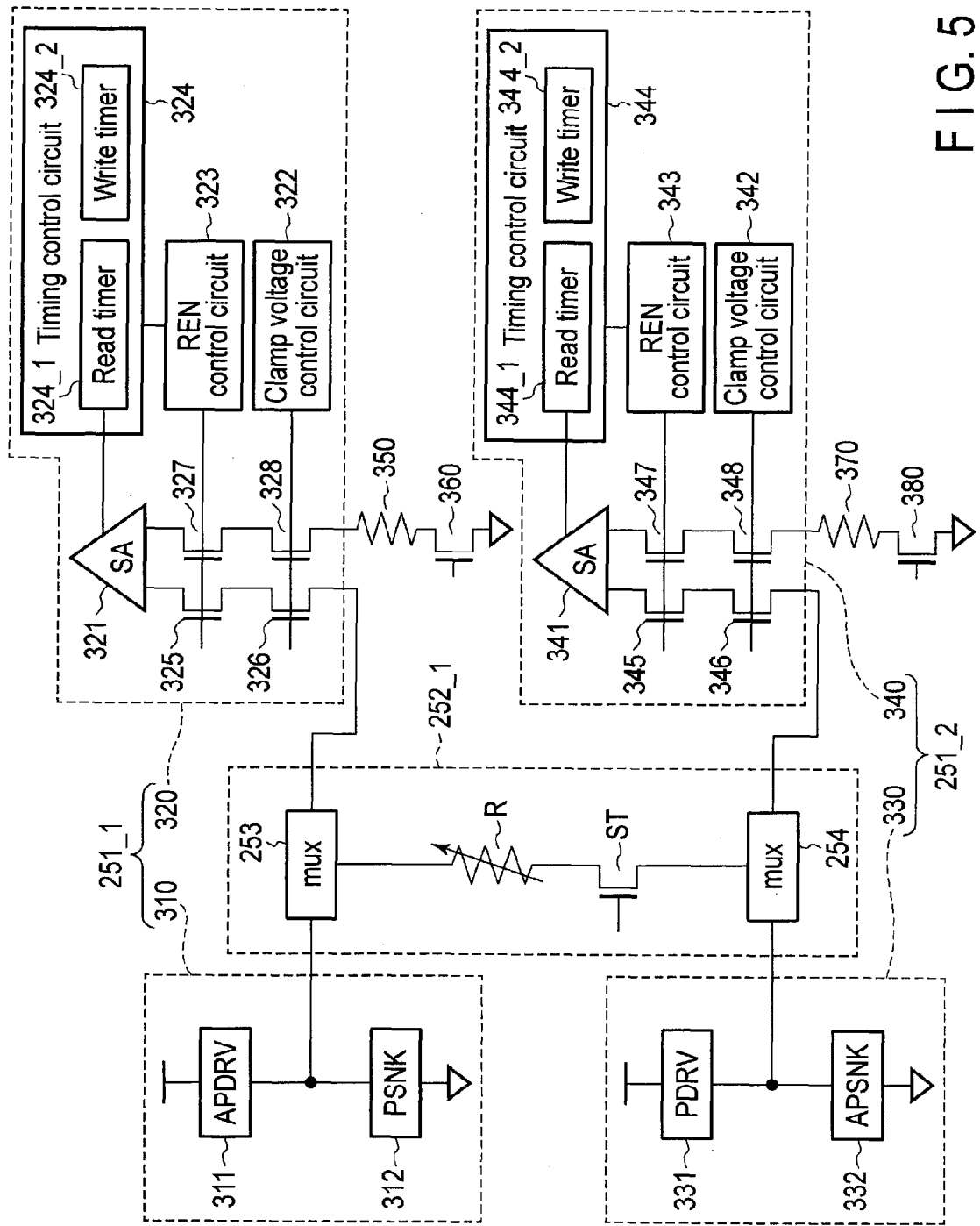
FIG. 5 is a schematic view showing write/read drivers according to the first embodiment.

FIG. 5 is a schematic view showing the write/read drivers according to the first embodiment. FIG. 5 shows the write/read drivers 251_1 and 251_2 and the memory mat 252_1 arranged between them shown in FIG. 4. Note that in the memory mat 252_1, only one memory cell MC and multiplexers 253 and 254 as connection terminals are shown.

As shown in FIG. 5, the write/read driver 251_1 includes a write driver 310 and read driver 320.

The write driver 310 includes an AP driver 311 and P sink 312. The AP driver 311 has one terminal electrically connected to a power supply terminal, and the other terminal electrically connected to one terminal of the P sink 312. The other terminal of the P sink 312 is electrically connected to a ground terminal. A connection point between the AP driver 311 and P sink 312 is electrically connected to one terminal of the memory cell MC (one terminal of the resistor R) via the multiplexer 253.

The AP driver 311 is formed by, e.g., a PMOS transistor having one terminal connected to the power supply terminal, and the other terminal electrically connected to one terminal of the memory cell MC via the multiplexer 253. The P sink 312 is formed by, e.g., an NMOS transistor having one terminal electrically connected to one terminal of the memory cell MC via the multiplexer 253, and the other terminal connected to the ground terminal.

The AP driver 311 operates in AP write (write to the AP state), and generates a write current to be applied to the memory cell MC. The P sink 312 operates in P write (write to the P state) and in P verify read after that, and functions as the terminal end portion of the write current and read current.

The read driver 320 includes a sense amplifier 321, a clamp voltage control circuit 322, an REN (Read ENable) control circuit 323, a timing control circuit 324, read enable transistors 325 and 327, and clamp transistors 326 and 328.

The first input terminal of the sense amplifier 321 is electrically connected to one terminal of the memory cell MC (one terminal of the resistor R) via the current paths of the read enable transistor 325 and clamp transistor 326 and the multiplexer 253. The second input terminal of the sense amplifier 321 is electrically connected to one terminal of a reference resistor 350 via the current paths of the read enable transistor 327 and clamp transistor 328. The other terminal of the reference resistor 350 is electrically connected to the ground terminal via the current path of a transistor 360. The sense amplifier 321 receives a timing control signal from the timing control circuit 324, and operates in accordance with the signal.

The sense amplifier 321 reads data stored in the memory cell MC (normal read and AP verify read) by comparing a cell current (a current flowing through the memory cell MC) input to the first input terminal with a reference current input to the second input terminal. In accordance with the timing control signal from the timing control circuit 324, therefore, the sense amplifier 321 operates in normal read and AP verify read, and generates read currents (a normal read current and AP verify read current).

The current path of the read enable transistor 325 has one end electrically connected to the first input terminal of the sense amplifier 321, and the other end electrically connected to one terminal of the clamp transistor 326. The other terminal of the clamp transistor 326 is electrically connected to one terminal of the memory cell MC via the multiplexer 253.

The current path of the read enable transistor 327 has one end electrically connected to the second input terminal of the sense amplifier 321, and the other end electrically connected to one terminal of the clamp transistor 328. The other terminal of the clamp transistor 328 is electrically connected to one terminal of the reference resistor 350. The other terminal of the reference resistor 350 is electrically connected to one end of the current path of the transistor 360. The other end of the current path of the transistor 360 is electrically connected to the ground terminal.

The REN control circuit 323 inputs an REN signal to the gates of the read enable transistors 325 and 327. The clamp voltage control circuit 322 inputs a clamp signal VCL to the gates of the clamp transistors 326 and 328.

The clamp voltage control circuit 322 generates the clamp signal VCL, and supplies the clamp signal VCL to the gates of the clamp transistors 326 and 328. The clamp voltage control circuit 322 generates VCLR as the clamp signal VCL in normal read, and VCLW larger than VCLR in verify read after a write operation.

The REN control circuit 323 generates the REN signal, and supplies the REN signal to the gates of the read enable transistors 325 and 327. The REN control circuit 323 receives the timing control signal from the timing control circuit 324, and operates in accordance with the signal.

The timing control circuit 324 includes a read timer 324_1 and write timer 324_2. The read timer 324_1 controls the timing of normal read, and outputs the timing signal to the sense amplifier 321 and REN control circuit 323. The write timer 324_2 controls the timing of verify read, and outputs the timing signal to the sense amplifier 321 and REN control circuit 323.

The write/read driver 251_2 includes a write driver 330 and read driver 340.

The write driver 330 includes a P driver 331 and AP sink 332. The P driver 331 has one terminal electrically connected to the power supply terminal, and the other terminal electrically connected to one terminal of the AP sink 332. The other terminal of the AP sink 332 is electrically connected to the ground terminal. A connection point between the P driver 331 and AP sink 332 is electrically connected to the other terminal of the memory cell MC (the other terminal of the selection transistor ST) via the multiplexer 254.

The P driver 331 is formed by, e.g., a PMOS transistor having one terminal connected to the power supply terminal, and the other terminal electrically connected to the other terminal of the memory cell MC via the multiplexer 254. The AP sink 332 is formed by, e.g., an NMOS transistor having one terminal electrically connected to the other terminal of the memory cell MC via the multiplexer 254, and the other terminal connected to the ground terminal.

The P driver 331 operates in P write (write to the P state), and generates a write current to be applied to the memory cell MC. The AP sink 332 operates in AP write (write to the AP state) and in AP verify read after that, and functions as the terminal end portion of the write current and read current.

The read driver 340 includes a sense amplifier 341, a clamp voltage control circuit 342, an REN (Read ENable) control circuit 343, a timing control circuit 344, read enable transistors 345 and 347, and clamp transistors 346 and 348.

The first input terminal of the sense amplifier 341 is electrically connected to the other terminal of the memory cell MC (the other terminal of the resistor R) via the current paths of the read enable transistor 345 and clamp transistor 346 and the multiplexer 254. The second input terminal of the sense amplifier 341 is electrically connected to one terminal of a reference resistor 370 via the current paths of the read enable transistor 347 and clamp transistor 348. The other terminal of the reference resistor 370 is electrically connected to the ground terminal via the current path of a transistor 380. The sense amplifier 341 receives a timing control signal from the timing control circuit 344, and operates in accordance with the signal.

The sense amplifier 341 reads data stored in the memory cell MC (normal read and P verify read) by comparing a cell current (a current flowing through the memory cell MC) input to the first input terminal with a reference current input to the second input terminal. In accordance with the timing control signal from the timing control circuit 344, therefore, the sense amplifier 341 operates in normal read and P verify read, and generates read currents (a normal read current and P verify read current).

The current path of the read enable transistor 345 has one end electrically connected to the first input terminal of the sense amplifier 341, and the other end electrically connected to one terminal of the clamp transistor 346. The other terminal of the clamp transistor 346 is electrically connected to the other terminal of the memory cell MC via the multiplexer 254.

The current path of the read enable transistor 347 has one end electrically connected to the second input terminal of the sense amplifier 341, and the other end electrically connected to one terminal of the clamp transistor 348. The other terminal of the clamp transistor 348 is electrically connected to one terminal of the reference resistor 370. The other terminal of the reference resistor 370 is electrically connected to one end of the current path of the transistor 380. The other end of the current path of the transistor 380 is electrically connected to the ground terminal.

The REN control circuit 343 outputs an REN signal to the gates of the read enable transistors 345 and 347. The clamp voltage control circuit 342 outputs a clamp signal VCL to the gates of the clamp transistors 346 and 348.

The clamp voltage control circuit 342 generates the clamp signal VCL, and supplies the clamp signal VCL to the gates of the clamp transistors 346 and 348. The clamp voltage control circuit 342 generates VCLR as the clamp signal VCL in normal read, and VCLW larger than VCLR in verify read after a write operation.

The REN control circuit 343 generates the REN signal, and supplies the REN signal to the read enable transistors 345 and 347. The REN control circuit 343 receives the timing control signal from the timing control circuit 344, and operates in accordance with the signal.

The timing control circuit 344 includes a read timer 344_1 and write timer 344_2. The read timer 344_1 controls the timing of normal read, and outputs the timing signal to the sense amplifier 341 and REN control circuit 343. The write timer 344_2 controls the timing of verify read, and outputs the timing signal to the sense amplifier 341 and REN control circuit 343.

Note that the timing control circuits 324 and 344, clamp voltage control circuits 322 and 342, and REN control circuits 323 and 343 may also be shared as one timing control circuit, one clamp voltage control circuit, and one REN control circuit by the read drivers 320 and 340.

[Operations in First Embodiment]

Operations of the memory chip in the first embodiment will be explained with reference to FIGS. 6, 7, 8, 9, and 10.

Figure 6:
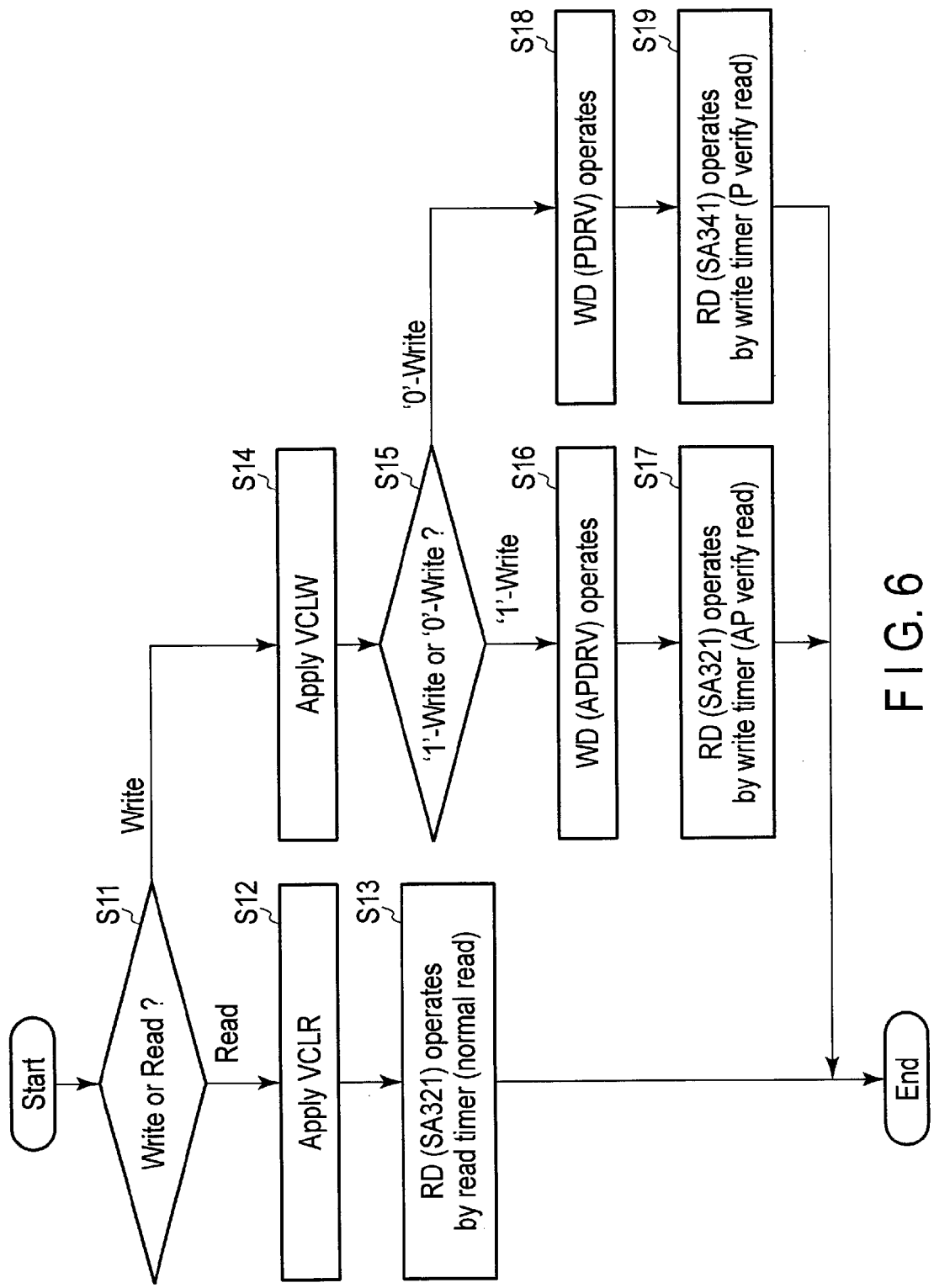
FIG. 6 is a flowchart showing an operation example of the memory chip according to the first embodiment.
Figure 8:
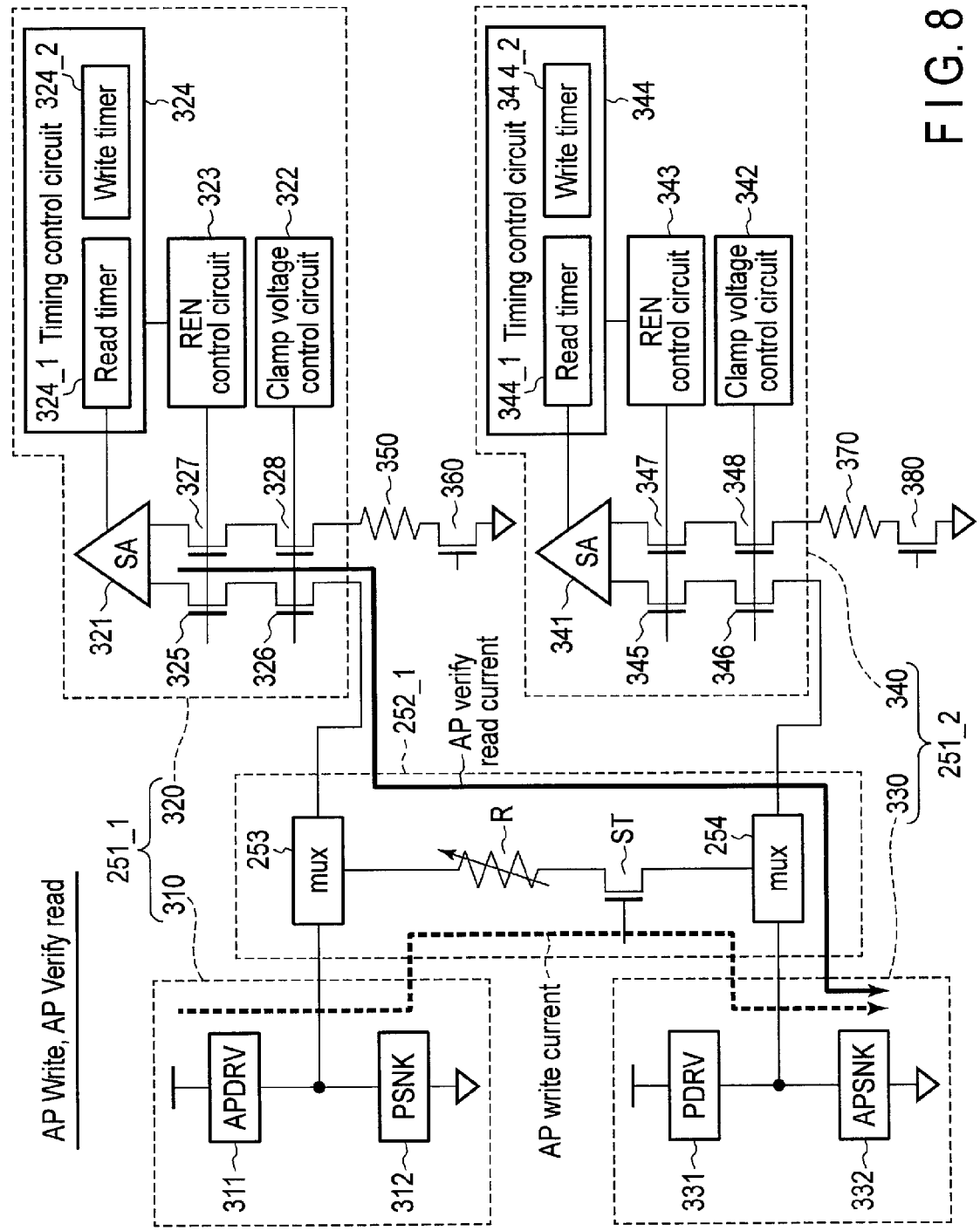
FIG. 8 is a schematic view showing an AP write operation and AP verify read operation of the memory chip according to the first embodiment.
Figure 9:
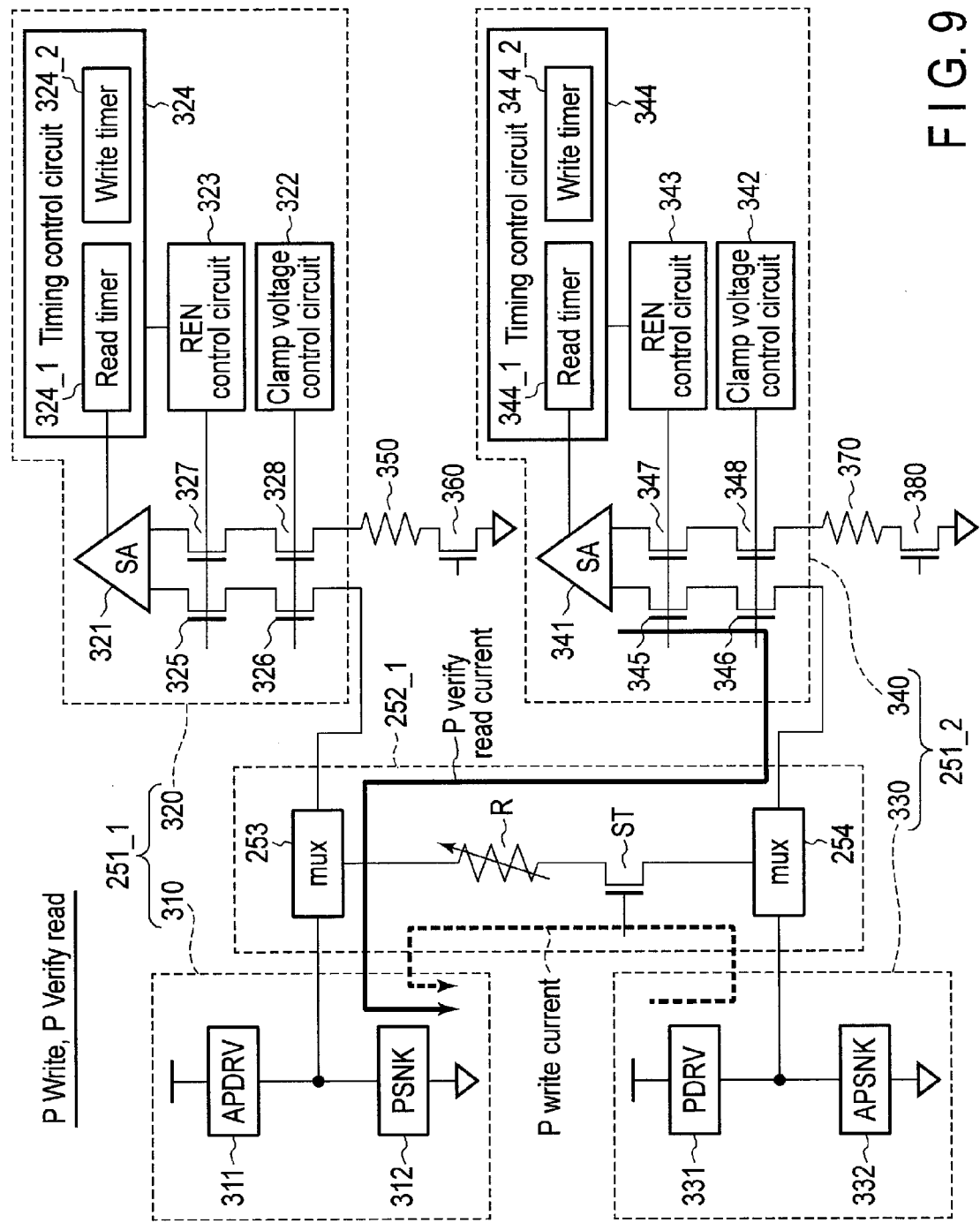
FIG. 9 is a schematic view showing a P write operation and P verify read operation of the memory chip according to the first embodiment.

FIG. 6 is a flowchart showing an operation example of the memory chip according to the first embodiment. FIG. 7 is a schematic view showing a normal read operation of the memory chip according to the first embodiment. FIG. 8 is a schematic view showing an AP write operation and AP verify read operation of the memory chip according to the first embodiment. FIG. 9 is a schematic view showing a P write operation and P verify read operation of the memory chip according to the first embodiment.

As shown in FIG. 6, in step S11, the main controller 230 first receives a write command or read command from the memory controller 100 via the command interface 211.

If the main controller 230 has received the read command in step S11, the process advances to step S12, and the clamp voltage control circuit 322 applies VCLR as the clamp signal VCL to the clamp transistors 326 and 328 under the control of the main controller 230.

Then, in step S13, the sense amplifier 321 and REN control circuit 323 receive the timing signal from the read timer 324_1, and operate at the timing of a normal read operation, under the control of the main controller 230. In this step, the AP sink 332 of the write driver 330 also operates. Thus, the normal read operation is performed.

If the main controller 230 has received the write command (e.g. '1' or '0' write command) in step S11, the process advances to step S14, and the clamp voltage control circuit 322 applies VCLW as the clamp signal VCL to the clamp transistors 326 and 328 under the control of the main controller 230. VCLW is larger than VCLR.

Subsequently, in step S15, the main controller 230 determines whether the write command from the memory controller 100 is '1' (AP) write or '0' (P) write.

If the write command is '1' write in step S15, the process advances to step S16, and the AP driver 311 of the write driver 310 operates under the control of the main controller 230. In this step, the AP sink 332 of the write driver 330 also operates. In this manner, a '1' write operation is performed.

After that, in step S17, the sense amplifier 321 and REN control circuit 323 receive the timing signal from the write timer 324_2, and operate at the timing of a verify read operation, under the control of the main controller 230. The timing signal from the write timer 324_2 is shorter than that from the read timer 324_1. Accordingly, a verify read operation (AP verify read operation) of '1' write is performed for a time shorter than that of the normal read operation. In addition, an AP verify read current is supplied in the same direction as that of the '1' write operation by driving the sense amplifier 321 and REN control circuit 323.

If the write command is '0' write in step S15, the process advances to step S18, and the P driver 331 of the write driver 330 operates under the control of the main controller 230. In this step, the P sink 312 of the write driver 310 also operates. In this manner, a '0' write operation is performed.

After that, in step S19, the sense amplifier 341 and REN control circuit 343 receive the timing signal from the write timer 344_2, and operate at the timing of a verify read operation, under the control of the main controller 230. The timing signal from the write timer 344_2 is shorter than that from the read timer 344_1. Accordingly, a verify read operation (P verify read operation) of '0' write is performed for a time shorter than that of the normal read operation. In addition, a P verify read current is supplied in the same direction as that of the '0' write operation by driving the sense amplifier 341 and REN control circuit 343.

Each of the operations (normal read, AP write and AP verify read, and P write and P verify read) will be explained in more detail below.

As shown in FIG. 7, the sense amplifier 321 and AP sink 332 operate in the normal read operation (step S13). Also, the REN control circuit 323 turns on the read enable transistor 325, and VCLR ('ML (Middle Low)' level) of the clamp voltage control circuit 322 turns on the clamp transistor 326. Consequently, a normal read current flows in a direction (AP write direction) from the sense amplifier 321 to the AP sink 332. In addition, a reference current flows when the read enable transistor 327 and clamp transistor 328 are turned on. The sense amplifier 321 reads data stored in the memory cell MC by comparing the cell current (normal read current) input to the first input terminal with the reference current input to the second input terminal.

As shown in FIG. 8, the AP driver 311 and AP sink 332 operate in the AP write operation (step S16). Therefore, an AP write current flows in a direction (AP write direction) from the AP driver 311 to the AP sink 332. As a consequence, data '1' is written to the memory cell MC.

Also, the sense amplifier 321 and AP sink 332 operate in the AP verify read operation (step S17). In addition, the REN control circuit 323 turns on the read enable transistor 325, and VCLW ('MH (Middle High)' level) of the clamp voltage control circuit 322 turns on the clamp transistor 326. Consequently, an AP verify read current flows in a direction (AP write direction) from the sense amplifier 321 to the AP sink 332. Furthermore, a reference current flows when the read enable transistor 327 and clamp transistor 328 are turned on.

In this state, the AP verify read current is larger than the normal read current because VCLW higher than VCLR turns on the clamp transistor 326. This is so because the AP verify read current flows in the AP write direction, and this makes it unnecessary to take the influence of read disturb into consideration. As a result, the time of the AP verify read operation can be made shorter than that of the normal read operation.

As shown in FIG. 9, the P driver 331 and P sink 312 operate in the P write operation (step S18). Therefore, a P write current flows in a direction (P write direction) from the P driver 331 to the P sink 312. As a consequence, data '0' is written to the memory cell MC.

Also, the sense amplifier 341 and P sink 312 operate in the P verify read operation (step S19). In addition, the REN control circuit 343 turns on the read enable transistor 345, and VCLW ('MH (Middle High)' level) of the clamp voltage control circuit 342 turns on the clamp transistor 346. Consequently, a P verify read current flows in a direction (P write direction) from the sense amplifier 341 to the P sink 312. Furthermore, a reference current flows when the read enable transistor 347 and clamp transistor 348 are turned on.

In this state, the P verify read current is larger than the normal read current because VCLW higher than VCLR turns on the clamp transistor 346. This is so because the P verify read current flows in the P write direction, and this makes it unnecessary to take the influence of read disturb into consideration. As a result, the time of the P verify read operation can be made shorter than that of the normal read operation.

Figure 10:
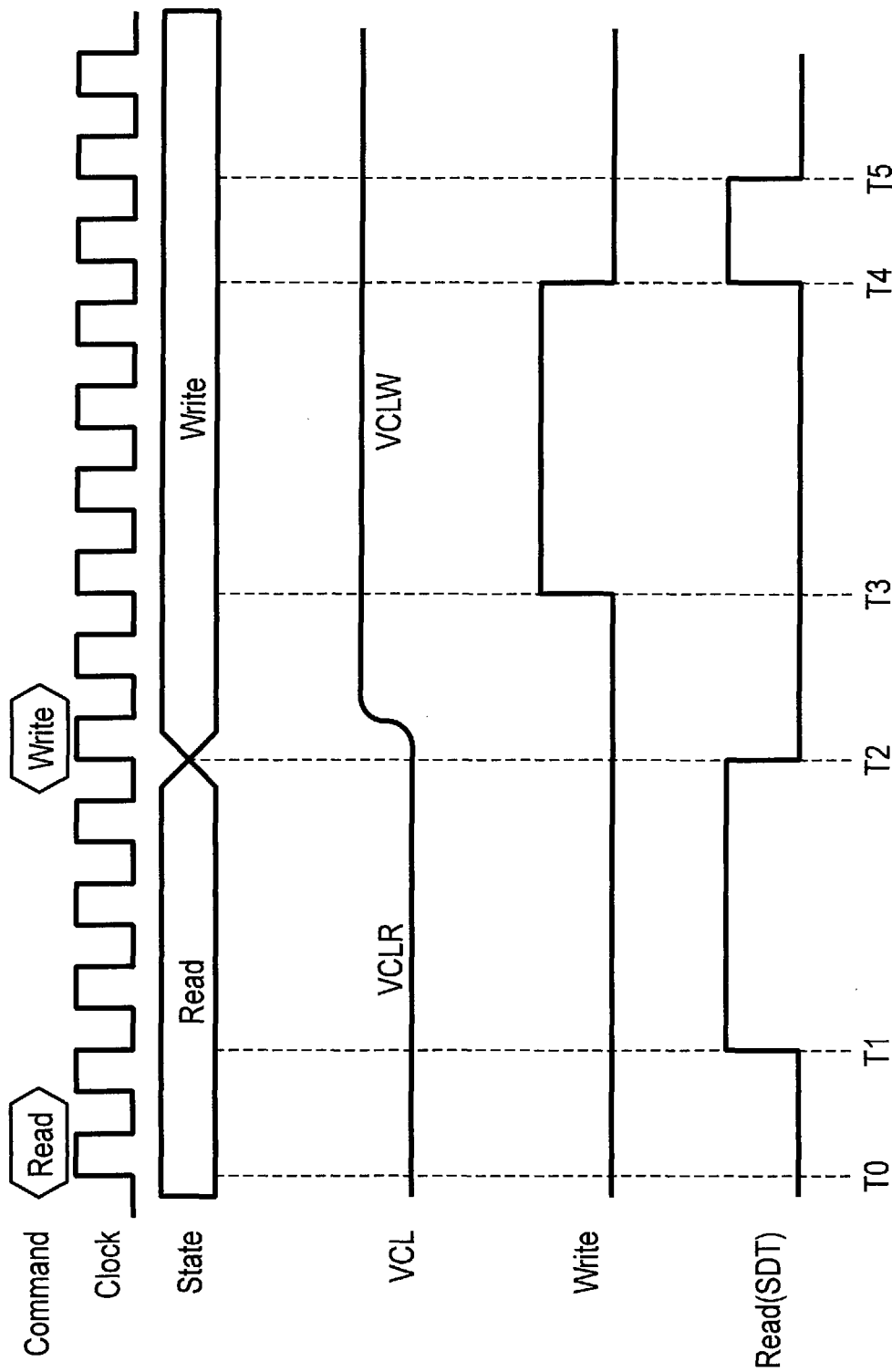
FIG. 10 is a timing chart showing an operation example of the memory chip according to the first embodiment.

FIG. 10 is a timing chart showing an example of the operation of the memory chip according to the first embodiment.

As shown in FIG. 10, at time T0, the main controller 230 enters a read state by receiving a read command from the memory controller 100 together with a clock having a fixed frequency. Then, the main controller 230 receives a signal related to the voltage of the normal read operation from the voltage controller 240, and controls the clamp voltage control circuit 323 (343) to generate VCLR as the clamp signal VCL.

After that, at time T1, the sense amplifier 321 and REN control circuit 323 operate at the timing of the normal read operation in accordance with the timing signal from the read timer 324_1 (SDT: Signal Development Time). In this manner, the normal read operation is performed.

Subsequently, at time T2, the operations of the sense amplifier 321 and REN control circuit 323 stop, and the main controller 230 enters a write state by receiving a write command from the memory controller 100. Then, the main controller 230 receives a signal related to the voltage of the verify read operation from the voltage controller 240, and controls the clamp voltage control circuit 323 (343) to generate VCLW as the clamp signal VCL. That is, the clamp voltage control circuit 323 (343) raises the clamp signal VCL from VCLR to VCLW.

Then, at time T3, the AP driver 311 of the write driver 310 operates in the AP write operation. At this time, the AP sink 332 of the write driver 330 operates. The AP write operation is thus performed. On the other hand, the P driver 331 of the write driver 330 operates in the P write operation. At this time, the P sink 312 of the write driver 310 operates. The P write operation is thus performed.

After that, at time T4, the sense amplifier 321 and REN control circuit 323 operate in the AP write operation at the timing of the verify read operation in accordance with the timing signal from the write timer 324_2. Consequently, the verify read operation of AP write (the AP verify read operation) is performed for a time (from time T4 to time T5) shorter than the time (from time T1 to time T2) of the normal read operation. On the other hand, the sense amplifier 341 and REN control circuit 343 operate in the P write operation at the timing of the verify read operation in accordance with the timing signal from the write timer 344_2. Consequently, the verify read operation of P write (the P verify read operation) is performed for a time shorter than that of the normal read operation.

[Effects of First Embodiment]

When performing verify read after write in the above-mentioned first embodiment, the verify read current is applied to the memory cell MC in the direction in which data (AP data or P data) is written to the memory cell MC. This makes it possible to prevent the occurrence of read disturb by which data is inverted by the read current. Accordingly, the verify read current can be increased without taking account of the influence of read disturb. As a consequence, the verify read time can be shortened.

<Second Embodiment>

A semiconductor memory device according to the second embodiment will be explained below with reference to FIGS. 11 and 12.

When data '1 (AP)' is a high resistance and data '0 (P)' is a low resistance in an MRAM, the breakage of an insulating film in a memory cell often occurs in '1' write in which a cell voltage is large. Also, even if breakage occurs in '0' write, the broken cell can be handled as a low resistance with respect to '1' write, so the cell poses no particular problem as a replacement of data '0'.

In the second embodiment, break detection read is performed on a memory cell MC as verify read after write similar to that in the first embodiment. This break detection read is performed only after AP write for the above-mentioned reason. This makes it possible to omit break detection read after P write, thereby shortening the time of break detection read. The second embodiment will be explained in detail below.

Note that in the second embodiment, an explanation of the same features as those of the above-mentioned first embodiment will be omitted, and differences will mainly be explained.

<Operations in Second Embodiment>

Operations of a memory chip in the second embodiment will be explained with reference to FIGS. 11 and 12.

Figure 11:
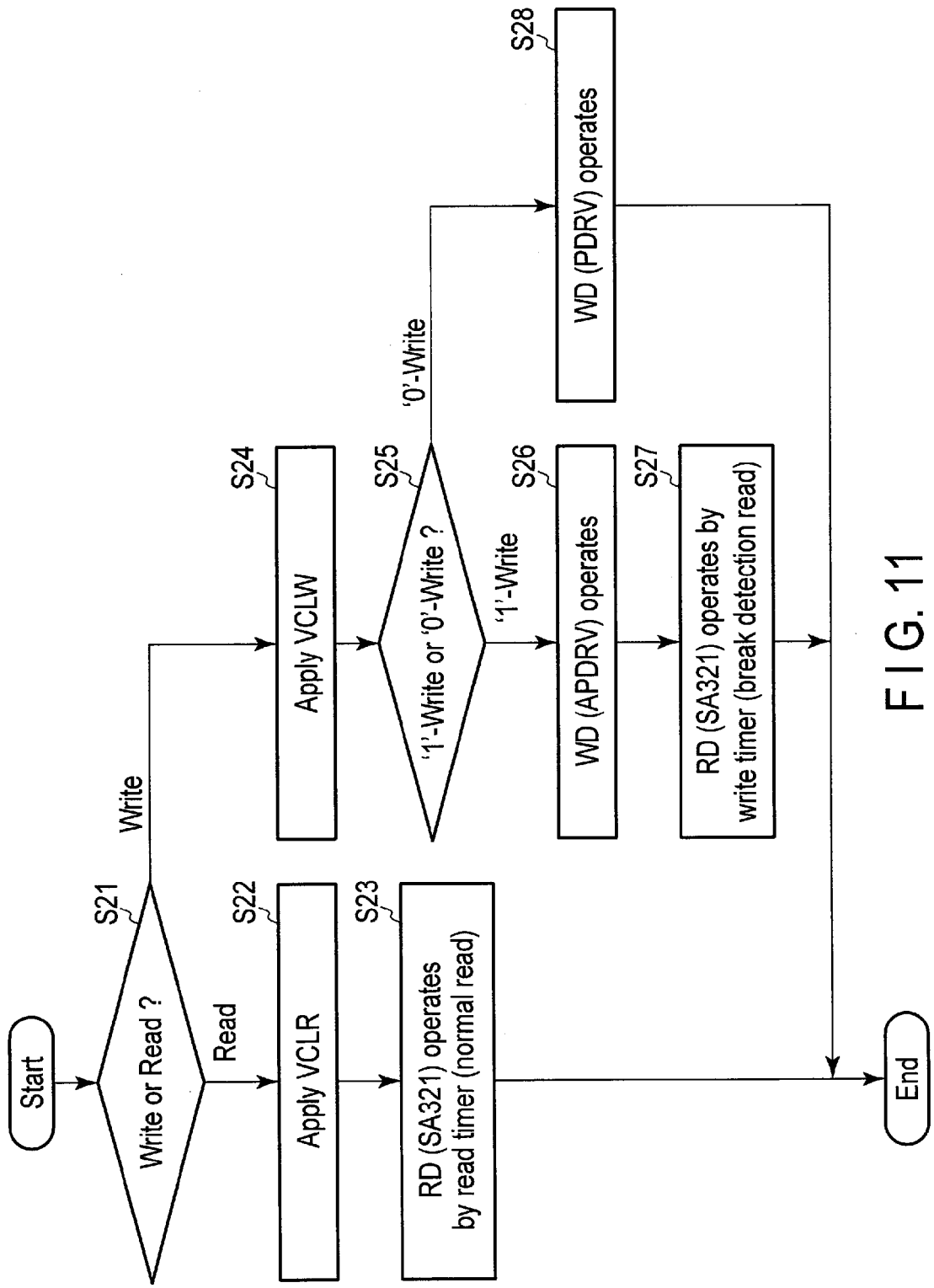
FIG. 11 is a flowchart showing an operation example of a memory chip according to the second embodiment.

FIG. 11 is a flowchart showing an operation example of the memory chip according to the second embodiment. FIG. 12 is a graph showing the resistance distribution of the memory cell according to the second embodiment.

The difference between the second embodiment and the above first embodiment is that break detection read is performed as verify read. In addition, this break detection read is performed only after an AP write operation.

As shown in FIG. 11, in step S21, a main controller 230 first receives a write command or read commend from a memory controller 100 via a command interface 211.

If the main controller 230 has received the read command in step S21, the same processes as in steps S12 and S13 of the first embodiment are performed in steps S22 and S23. That is, a normal read operation is performed.

If the main controller 230 has received the write command in step S21, the process advances to step S24, and a clamp voltage control circuit 322 applies VCLW as a clamp signal VCL to clamp transistors 326 and 328 under the control of the main controller 230. VCLW is larger than VCLR.

Then, in step S25, the main controller 230 determines whether the write command from the memory controller 100 is '1' (AP) write or '0' (P) write.

If the write command is '1' write in step S25, the process advances to step S26, and an AP driver 311 of a write driver 310 operates under the control of the main controller 230. In this step, an AP sink 332 of a write driver 330 also operates. In this manner, a '1' write operation is performed.

After that, in step S27, a sense amplifier 321 and REN control circuit 323 receive a timing signal from a write timer 324_2, and operate at the timing of a verify read operation, under the control of the main controller 230. In this step, break detection read for confirming insulation breakdown of the memory cell is performed as verify read.

Also, the timing signal from the write timer 324_2 is shorter than that from a read timer 324_1. Accordingly, a break detection read operation is performed for a time shorter than that of the normal read operation. In addition, a break detection read current is supplied in the same direction as that of the '1' write operation by driving the sense amplifier 321 and REN control circuit 323.

Figure 12:
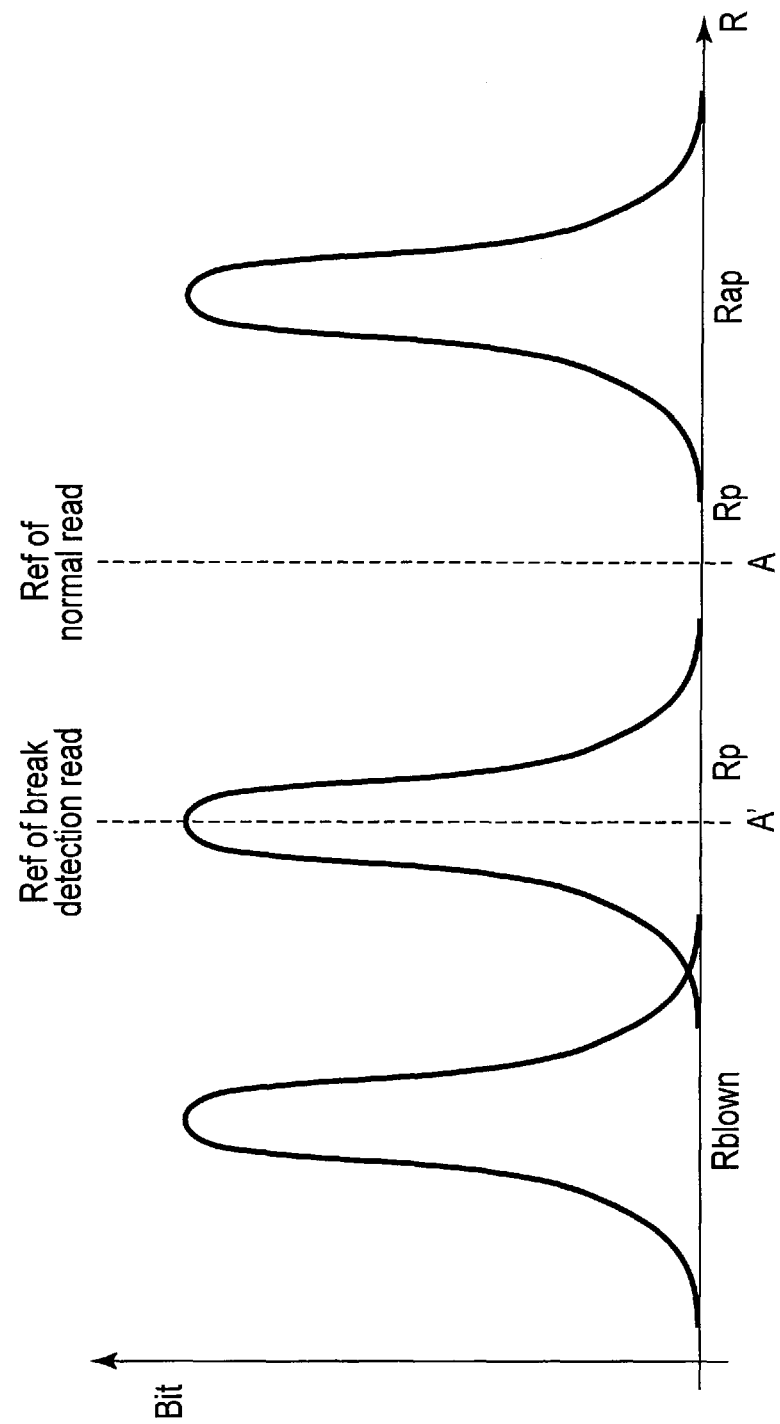
FIG. 12 is a graph showing the resistance distribution of a memory cell according to the second embodiment.

As shown in FIG. 12, break detection read is performed at a reference resistance A' lower than a reference resistance A in normal read. The reference resistance A' is set to be equal to, e.g., a resistance Rp of a cell in a P state. This is so because a resistance Rblown of a broken cell is lower than the resistance Rp of a cell in the P state. That is, the difference between a resistance Rap in an AP state and the resistance Rblown of a broken cell is larger than the difference between the resistance Rap in the AP state and the resistance Rp of a cell in the P state. By setting the reference resistance A' to be equal to the resistance Rp of a cell in the P state, it is possible to increase the margin of a reference value with respect to the influence of a voltage or temperature.

If the write command is '0' write in step S25, a P driver 331 of the write driver 330 operates under the control of the main controller 230 in step S28. In this step, a P sink 312 of the write driver 310 also operates. In this manner, a '0' write operation is performed.

After this '0' write operation, no break detection read is performed. This is so because a cell voltage in '0' data write is relatively small and hence hardly causes breakage. Also, even if breakage occurs, the broken cell can be handled as a data '0' cell.

[Effects of Second Embodiment]

In the above-mentioned second embodiment, break detection read for confirming insulation breakdown of the memory cell MC is performed as verify read after write similar to that of the first embodiment. In addition, this break detection read is performed only after AP write. Accordingly, it is possible to omit break detection read after P write, thereby shortening the time of break detection read.

Also, the resistance of a broken cell is further lower than the resistance of data '0'. That is, the difference between the resistance of a broken cell and the resistance of data '1' is relatively large. Therefore, the margin of the reference resistance in break detection read can be set wider than that in normal read.

<Third Embodiment>

A semiconductor memory device according to the third embodiment will be explained below with reference to FIGS. 13, 14, 15, and 16.

In the third embodiment, if a broken cell is detected in break detection read (after product shipment) of the second embodiment, the broken cell is repaired. In this case, the broken cell is repaired by using a one-dimensional repair area (redundancy BISRRD). Since this makes the repair method easy, a repair solution (e.g., redundancy address allocation) can be calculated inside a memory chip 200. The third embodiment will be explained in detail below.

Note that in the third embodiment, an explanation of the same features as those of the above-mentioned embodiments will be omitted, and differences will mainly be explained.

[Arrangement and Operation of Third Embodiment]

The arrangement and operation of the nonvolatile semiconductor memory device according to the third embodiment will be explained with reference to FIGS. 13, 14, 15, and 16.

Figure 13:
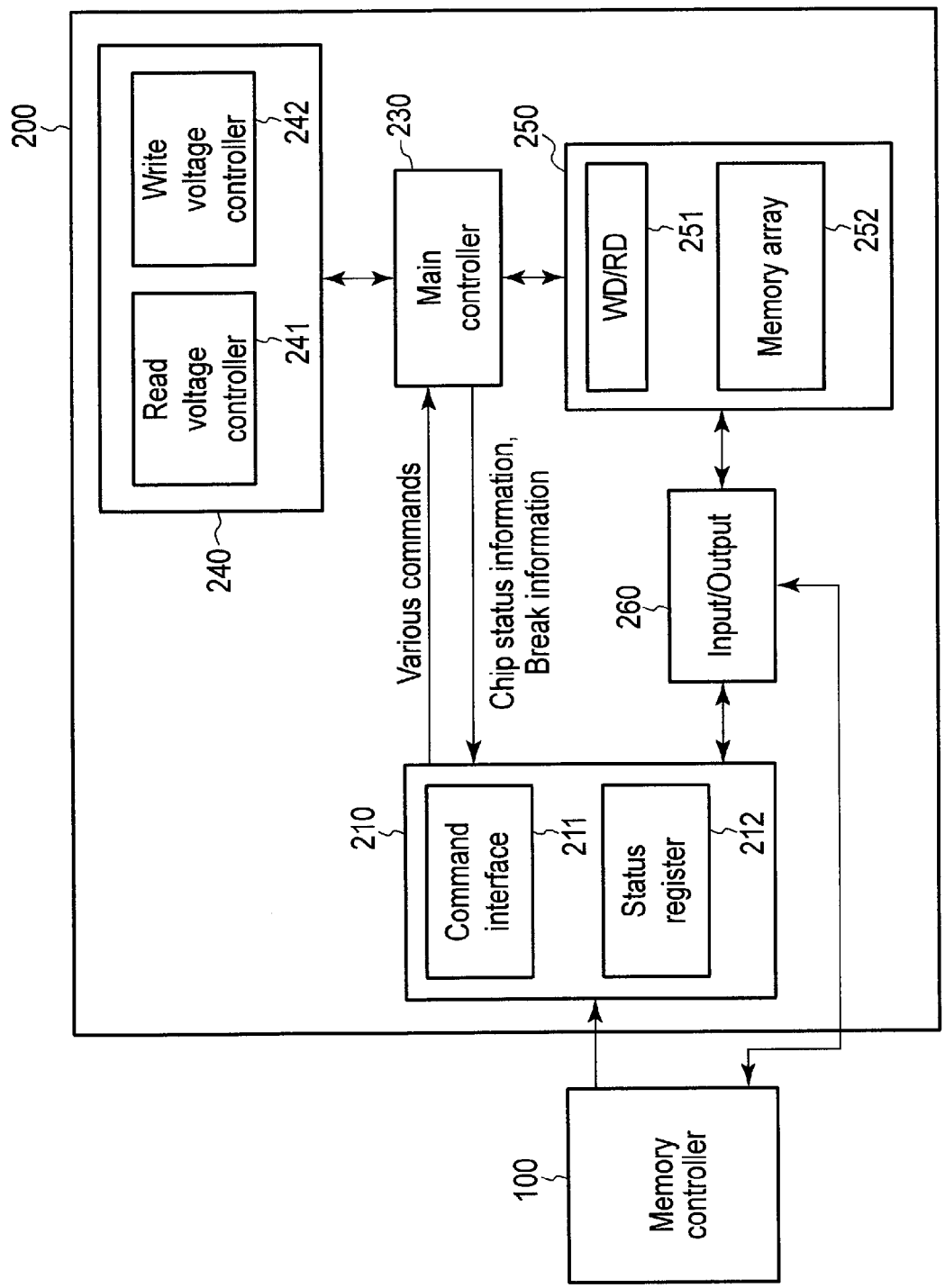
FIG. 13 is a schematic view showing the arrangement of a memory chip according to the third embodiment.

FIG. 13 is a schematic view showing the arrangement of the memory chip according to the third embodiment.

As shown in FIG. 13, the memory chip 200 includes an interface circuit 210, main controller 230, voltage controller 240, memory cell array region 250, and input/output circuit 260.

The differences between the third embodiment and the above-mentioned embodiments are in the operations of the main controller 230 and a status register 212.

The main controller 230 detects a broken cell in the memory cell array region 250, and transfers break information containing a break flag and broken cell address to the status register 212. The status register 212 temporarily stores the break information of the memory array region 250, which is transferred from the main controller 230, and transfers the information to a memory controller 100 via the input/output circuit 260.

Figure 15B:
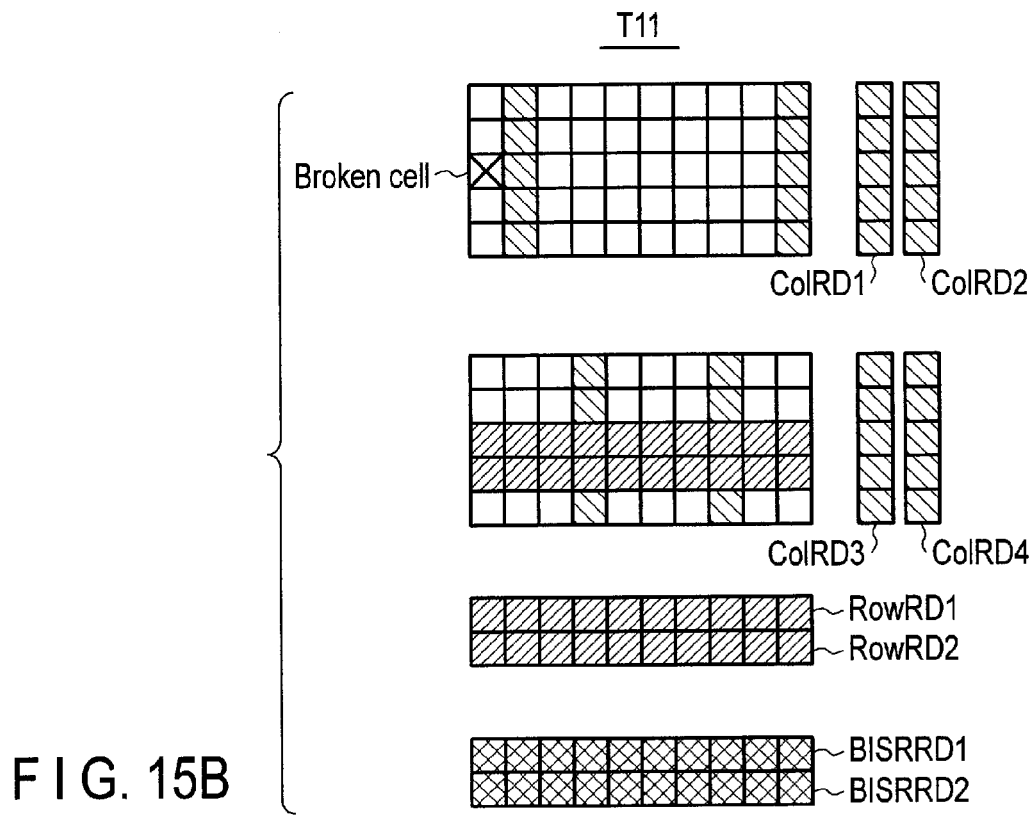
FIG. 15B is a view schematically showing break detection at time T11 after product shipment according to the third embodiment.
Figure 15C:
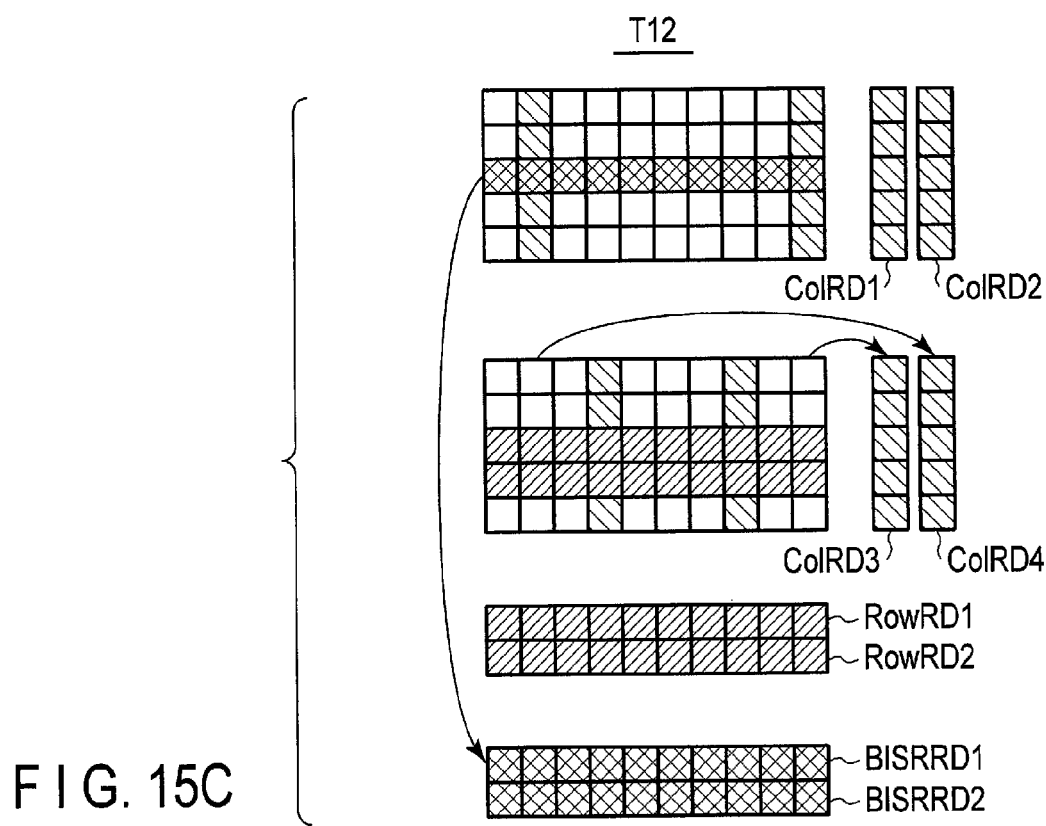
FIG. 15C is a view schematically showing a repair method at time T12 after product shipment according to the third embodiment.

FIG. 14 is a flowchart showing break detection and a repair method in the nonvolatile semiconductor memory device according to the third embodiment. FIG. 15A is a view schematically showing a repair method at time T10 in product shipment according to the third embodiment. FIG. 15B is a view schematically showing break detection at time T11 after product shipment according to the third embodiment. FIG. 15C is a view schematically showing a repair method at time T12 after product shipment according to the third embodiment.

In this embodiment, as shown in FIG. 15A, the memory array includes a memory mat including column addresses C0 to C9 and row addresses R0 to R9, and redundancies ColRD1 to ColRD4, RowRD1, RowRD2, BISR(Built in Self-Repair)RD1, and BISRRD2. This embodiment shows an example in which, when a product is shipped, portions of the column addresses C1 and C9 are respectively repaired by the redundancies ColRD2 and ColRD1, portions of the column addresses C3 and C7 are respectively repaired by the redundancies ColRD3 and ColRD4, and the row addresses R7 and R8 are respectively repaired by the redundancies RowRD2 and RowRD1.

As described above, the repair method in product shipment is performed using the redundancies ColRD and RowRD as a two-dimensional repair area. Therefore, complicated calculations are necessary to decide redundancies for use in repair. A general-purpose memory (stand-alone memory) using a memory function alone as one chip and a memory (embedded memory) in which a memory function is incorporated into a chip as a part of a system function are different in status of a repair calculation circuit. In the stand-alone memory, it is difficult to incorporate a complicated repair calculation circuit into the memory chip 200. In the stand-alone memory, therefore, a repair calculation circuit for a two-dimensional repair does not exist in a chip, but is incorporated into a memory tester, and calculates a repair method in a manufacturing test. In the embedded memory, a repair calculation circuit is often incorporated into an external device (the memory controller 100) of the memory chip 200.

Break detection and the repair method of the third embodiment are performed after product shipment (time T11 shown in FIG. 15B and time T12 shown in FIG. 15C). Break detection and the repair method of the third embodiment will be explained below.

As shown in FIG. 14, the memory chip 200 first detects a broken cell in step S31. This break detection is performed by break detection read explained in the second embodiment. In this embodiment, break detection will be explained by taking a case in which a memory cell at address C0R2 is the broken cell as shown in FIG. 15B as an example.

Then, in step S32, the memory chip 200 holds break information. More specifically, the main controller 230 transfers break information containing a broken cell address (in this example, address C0R2 shown in FIG. 15B) and a break flag to the status register 212, and the status register 212 temporarily holds this break information.

Subsequently, in step S33, the memory chip 200 transfers the break flag to the memory controller 100. More specifically, the break flag stored in the status register 212 is transferred to the memory controller 100.

In step S34, the memory controller 100 transfers a status read command to the memory chip 200.

Then, when the device is an embedded memory, the memory chip 200 having received the status read command transfers the broken cell address to the memory controller 100 in step S35. More specifically, the broken cell address stored in the status register 212 is transferred to the memory controller 100.

On the other hand, when the device is a simple memory, the memory chip 200 holds the broken cell address and transfers only the fact that breakage has occurred to the memory controller 100 in step S35.

Subsequently, in step S36, the memory controller 100 transfers a repair command for the broken cell to the memory chip 200.

In step S37, the memory chip 200 having received the repair command transfers repair data. More specifically, as shown in FIG. 15C, data in row address R2 (addresses C0R2 to C9R2) including the broken cell is transferred to the redundancy RISRRD1. In this case, data of the broken cell (data at address C0R2) is detected only when writing data '1'. Therefore, data '1' is written to a cell in the redundancy RISRRD1 to which the data of the broken cell is transferred. Data in the broken cell address is used as '1'.

As described above, the repair method after product shipment is performed using the redundancy BISRRD as a one-dimensional repair area. This makes the calculation easier than that when using a two-dimensional repair area. Accordingly, the repair calculation circuit need only have a simple arrangement and can be incorporated into the memory chip 200.

In step S38, the memory chip 200 stores repair address data as nonvolatile data. More specifically, the repair address data (row address R2 (addresses C0R2 to C9R2) is stored in a BISRRD data unit 237 (to be described later) of the main controller 230.

Note that the redundancy BISRRD is one-dimensional in the row direction in this example, but the present invention is not limited to this. The repair process can similarly be performed even when the redundancy BISRRD is one-dimensional in the column direction.

FIG. 16 is a schematic view showing the arrangement of the main controller according to the third embodiment, and shows an arrangement in which access to the above-described repair area is possible in individual operations (write and read operations). Note that FIG. 16 does not show an arrangement for redundancy in the column direction, and shows only an arrangement for redundancy in the row direction.

The main controller 230 includes an address decoder 231, a row decoder 232, an RD comparator 233, an RD data unit 234, a row RD decoder 235, a BISRRD comparator 236, the BISRRD data unit 237, and a row BISRRD decoder 238.

The address decoder 231 decodes a row address signal Address designated from an external device (the memory controller 100), and outputs the decoded row address signal to the row decoder 232.

The RD comparator 233 compares the repair address data (e.g., row addresses R7 and R8 shown in FIG. 15A, which are repaired in product shipment) stored in the RD data unit 234 with the externally input address (row address signal Address). If the two addresses match, the RD comparator 233 activates an RD repair signal HITRD (sets it at 'H' level), and outputs the RD repair signal HITRD to the row decoder 232 and row RD decoder 235.

The BISRRD comparator 236 compares the repair address data (e.g., the row address R2 shown in FIG. 15C, which is repaired after product shipment) stored in the BISRRD data unit 237 with the externally input address (the row address signal Address). If the two addresses match, the BISRRD comparator 236 activates a BISRRD repair signal HITRDB, and outputs the BISRRD repair signal HITRDB to the row decoder 232, row RD decoder 235, and row BISRRD decoder 238.

If neither the RD repair signal HITRD nor the BISRRD repair signal HITRDB is activated (if both the signals are at 'L' level), the row decoder 232 activates a signal ROW(#) of a normal cell (a memory cell of the memory mat). That is, the row decoder 232 determines that the externally input address is not a repair address, and accesses a memory cell of the memory mat in accordance with the input address.

On the other hand, if at least one of the RD repair signal HITRD from the RD comparator 233 and the BISRRD repair signal HITRDB from the BISRRD comparator 236 is activated, the row decoder 232 does not activate the signal ROW(#) of a normal cell (a memory cell of the memory mat). That is, the row decoder 232 determines that the externally input address is a repair address, and does not access any memory cell of the memory mat.

The row RD decoder 235 activates a signal ROWRD(#) of the redundancy RowRD if the RD repair signal HITRD is at 'H' level and the BISRRD repair signal HITRDB is at 'L' level. That is, the row RD decoder 235 determines that the externally input address is a repair address at the time of product shipment, and accesses the redundancy RowRD stored in the RD data unit 234.

On the other hand, the row RD decoder 235 does not activate the signal ROWRD(#) of the redundancy RowRD if the RD repair signal HITRD is at 'H' level and the BISRRD repair signal HITRDB is at 'H' level. That is, the row RD decoder 235 determines that the externally input address is a repair address at the time of product shipment, but also determines that the externally input address is a repair address after product shipment, and does not access the redundancy RowRD stored in the RD data unit 234.

Also, the row RD decoder 235 does not activate the signal ROWRD(#) of the redundancy RowRD if the RD repair signal HITRD is at 'L' level. That is, the row RD decoder 235 determines that the externally input address is not a repair address at the time of product shipment, and does not access the redundancy RowRD stored in the RD data unit 234.

The row BISRRD decoder 238 activates the signal ROWRDB(#) of the redundancy BISRRD if the BISRRD repair signal HITRDB is at 'H' level. That is, the row BISRRD decoder 238 determines that the externally input address is a repair address after product shipment, and accesses the redundancy BISRRD stored in the BISRRD data unit 237.

On the other hand, the row BISRRD decoder 238 does not activate the signal ROWRDB(#) of the redundancy BISRRD if the BISRRD repair signal HITRDB is at 'L' level. That is, the row BISRRD decoder 238 determines that the externally input address is not a repair address after product shipment, and does not access the redundancy BISRRD stored in the BISRRD data unit 237.

[Effects of Third Embodiment]

In the above-mentioned third embodiment, in break detection read (after product shipment) of the second embodiment, a broken cell is repaired if it is detected. In this repair (repair process) of the broken cell after product shipment, the broken cell is repaired not by using a two-dimensional repair area (the redundancies ColRD and RowRD) like that in product shipment, but by using a one-dimensional repair area (the redundancy BISRRD). Since this facilitates the repair method, the repair solution or relief solution (e.g., redundancy address allocation) can be calculated inside the memory chip 200.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
a memory mat including a memory cell having a variable resistance element;
a write driver which applies a write current to the memory cell, the write current flowing in the memory cell in one of a first current direction and a second current direction opposite to the first current direction in write; and
a read driver which applies a verify read current to the memory cell, the verify read current flowing in the memory cell in the first current direction in verify read after write in a case in which the write current flows in the first current direction, and the verify read current flowing in the memory cell in the second current direction in verify read in a case in which the write current flows in the second current direction.

2. The device of claim 1, wherein:
the write current flows in the first current direction when writing a first logical value to the memory cell, and the write current flows in the second current direction when writing a second logical value to the memory cell, and
the verify read current flows in the first current direction in verify read after the first logical value is written to the memory cell, and the verify read current flows in the second current direction in verify read after the second logical value is written to the memory cell.

3. The device of claim 2, wherein the read driver applies a normal read current to the memory cell, the normal read current flowing in the memory cell in the first current direction in normal read.

4. The device of claim 3, wherein the verify read current is larger than the normal read current.

5. The device of claim 3, wherein a verify read time is shorter than a normal read time.

6. The device of claim 1, wherein the write driver comprises a first write driver electrically connected to one end of a current path of the memory cell, and a second write driver electrically connected to the other end of the current path.

7. The device of claim 1, wherein the read driver comprises a first sense amplifier electrically connected to one end of a current path of the memory cell, and a second sense amplifier electrically connected to the other end of the current path.

8. The device of claim 1, wherein the variable resistance element comprises a magnetoresistive element which changes a resistance in accordance with a magnetization direction.

9. A nonvolatile semiconductor memory device comprising:
a memory mat including a memory cell having a variable resistance element including first ferromagnetic layer, a second ferromagnetic layer, and a nonmagnetic layer between the first ferromagnetic layer and the second ferromagnetic layer;
a write driver which applies a write current to the memory cell, the write current flowing in the memory cell in a first current direction when writing a first logical value to the memory cell, and the write current flowing in the memory cell in a second current direction opposite to the first current direction when writing a second logical value having a resistance lower than a resistance of the first logical value to the memory cell in write; and
a read driver which applies a break detection read current to the memory cell, the break detection read current flowing in the memory cell in the first current direction in break detection read after the first logical value is written to the memory cell and which performs no break detection read after the second logical value is written to the memory cell, the read driver including a sense amplifier and a first transistor, the sense amplifier being electrically connected to one end of a current path of the memory cell, and a current between the sense amplifier and the memory cell flowing via the first transistor,
wherein:
a first voltage is applied to a gate of the first transistor in normal read, and
a second voltage higher than the first voltage is applied to the gate of the first transistor in break detection read.

10. The device of claim 9, wherein the read driver applies a normal read current to the memory cell, the normal read current flowing in the memory cell in the first current direction in normal read.

11. The device of claim 10, wherein a reference resistance in break detection read is lower than a reference resistance in normal read.

12. The device of claim 10, wherein the break detection read current is larger than the normal read current.

13. The device of claim 10, wherein a break detection read time is shorter than a normal read time.

14. The device of claim 9, wherein the write driver comprises a first write driver electrically connected to one end of a current path of the memory cell, and a second write driver electrically connected to the other end of the current path.

15. The device of claim 9, wherein the variable resistance element comprises a magnetoresistive element which changes a resistance in accordance with a magnetization direction.

16. The device of claim 9, further comprising a one dimensional repair area which repairs the memory cell when broken.

17. The device of claim 1, wherein:
the read driver includes a sense amplifier, and a first and a second transistor,
a current between the sense amplifier and the memory cell flows via the first and second transistors, the first transistor controls a volume of a read current, and the second transistor controls an on/off timing of the read current,
in normal read,
a first voltage is applied to a gate of the first transistor, and
a second voltage is applied to a gate of the second transistor for a first period of time, and
in verify read,
a third voltage higher than the first voltage is applied to the gate of the first transistor, and
the second voltage is applied to the gate of the first transistor for a second period of time which is shorter than the first period of time.

18. The device of claim 7, wherein:
the read driver includes a first and a second transistor,
a current between the first sense amplifier and the memory cell flows via the first transistor, and a current between the second sense amplifier and the memory cell flows via the second transistor,
a first voltage is applied to one of a gate of the first transistor and a gate of the second transistor in normal read,
a second voltage higher than the first voltage is applied to the gate of the first transistor in verify read in the case in which the write current flows in the first current direction, and
a third voltage higher than the first voltage is applied to the gate of the second transistor in verify read in the case in which the write current flows in the second current direction.

19. The device of claim 7, wherein:
the read driver includes a first and a second transistor,
a current between the first sense amplifier and the memory cell flows via the first transistor, and a current between the second sense amplifier and the memory cell flows via the second transistor,
a first voltage is applied to one of a gate of the first transistor and a gate of the second transistor for a first period of time in normal read,
the first voltage is applied to the gate of the first transistor for a second period of time shorter than the first period of time in verify read in the case in which the write current flow in the first current direction, and
the first voltage is applied to the gate of the second transistor for the second period of time in verify read in the case in which the write current flow in the second current direction.

20. The device of claim 9, wherein:
the read driver includes a second transistor,
a current between the sense amplifier and the memory cell flows via the second transistor,
a first voltage is applied to a gate of the second transistor for a first period of time in normal read, and
the first voltage is applied to the gate of the second transistor for a second period of time shorter than the first period of time in break detection read.

* * * * *